(12) United States Patent
Bonkohara

(10) Patent No.: US 9,386,685 B2
(45) Date of Patent: Jul. 5, 2016

(54) INTERPOSER AND SEMICONDUCTOR MODULE USING THE SAME

(75) Inventor: Manabu Bonkohara, Kanagawa (JP)

(73) Assignee: ZYCUBE CO., LTD., Yokohama-shi (JP)

(*) Notice: Subject to any disclaimer, the term of this patent is extended or adjusted under 35 U.S.C. 154(b) by 291 days.

(21) Appl. No.: 13/977,908

(22) PCT Filed: Dec. 28, 2011

(86) PCT No.: PCT/JP2011/080528
§ 371 (c)(1),
(2), (4) Date: Sep. 30, 2013

(87) PCT Pub. No.: WO2012/091140
PCT Pub. Date: Jul. 5, 2012

(65) Prior Publication Data
US 2014/0016270 A1 Jan. 16, 2014

(30) Foreign Application Priority Data

Dec. 30, 2010 (JP) .................................. 2010-294618

(51) Int. Cl.
*H05K 1/02* (2006.01)
*H01L 23/34* (2006.01)
(Continued)

(52) U.S. Cl.
CPC .............. *H05K 1/0203* (2013.01); *H01L 23/34* (2013.01); *H01L 23/467* (2013.01); *H01L 23/473* (2013.01); *H01L 23/49827* (2013.01); *H01L 25/0657* (2013.01); *H05K 7/2039* (2013.01); *H05K 7/20218* (2013.01); *H01L 24/48* (2013.01); *H01L 24/73* (2013.01); *H01L 2224/32145* (2013.01); *H01L 2224/32225* (2013.01); *H01L 2224/451* (2013.01); *H01L 2224/48227* (2013.01);
(Continued)

(58) Field of Classification Search
None
See application file for complete search history.

(56) References Cited

U.S. PATENT DOCUMENTS 6,980,418 B1 * 12/2005 Seeger et al. ............. 361/679.54
7,864,532 B1 * 1/2011 Ehret ................. H01Q 13/0283
165/104.26

(Continued)

FOREIGN PATENT DOCUMENTS

JP 58-21095 A 2/1983
JP 61-119893 A 6/1986
(Continued)

OTHER PUBLICATIONS

Office Action dated Sep. 19, 2014, issued in corresponding Japanese Patent Application No. 2010-294618, with Partial Translation (5 pages).

(Continued)

*Primary Examiner* — Courtney Smith
(74) *Attorney, Agent, or Firm* — Westerman, Hattori, Daniels & Adrian, LLP

(57) ABSTRACT

An interposer is provided that suppresses heat conduction more effectively between two heat sources when the interposer is placed between the heat sources.
An interposer 24 comprises a body having a cavity 23 maintained in vacuum; insulating layers 22a and 22b formed respectively on upper and lower walls 20a and 20b of the body; and heat reflecting layers 21a and 21b formed respectively on the insulating layers 22a and 22b. The interposer 24 thermally insulates semiconductor devices 11a and 21a mounted respectively on upper and lower sides of the interposer 24.

16 Claims, 17 Drawing Sheets

(51) Int. Cl.
   *H01L 23/498*   (2006.01)
   *H01L 25/065*   (2006.01)
   *H05K 7/20*     (2006.01)
   *H01L 23/467*   (2006.01)
   *H01L 23/473*   (2006.01)
   *H01L 23/00*    (2006.01)

(52) U.S. Cl.
   CPC ........... *H01L 2224/48472* (2013.01); *H01L 2224/73265* (2013.01); *H01L 2225/0651* (2013.01); *H01L 2225/06513* (2013.01); *H01L 2225/06517* (2013.01); *H01L 2225/06548* (2013.01); *H01L 2225/06572* (2013.01); *H01L 2225/06575* (2013.01); *H01L 2924/00014* (2013.01); *H01L 2924/01019* (2013.01); *H01L 2924/12044* (2013.01)

(56) References Cited

U.S. PATENT DOCUMENTS

| | | | | |
|---|---|---|---|---|
| 8,081,471 | B2* | 12/2011 | Abert | H05K 7/1468 174/547 |
| 2004/0104738 | A1* | 6/2004 | Mori | 324/754 |
| 2007/0076355 | A1* | 4/2007 | Oohama | H01L 25/117 361/676 |
| 2007/0148502 | A1* | 6/2007 | Terazaki | 429/12 |
| 2009/0091904 | A1* | 4/2009 | Hatanaka et al. | 361/764 |
| 2009/0101897 | A1* | 4/2009 | Murphy et al. | 257/48 |
| 2009/0311826 | A1* | 12/2009 | Bernstein et al. | 438/106 |
| 2011/0127546 | A1* | 6/2011 | Jaus et al. | 257/81 |
| 2012/0243166 | A1* | 9/2012 | Burton et al. | 361/679.31 |

FOREIGN PATENT DOCUMENTS

| | | |
|---|---|---|
| JP | 09-270524 A | 10/1997 |
| JP | 2005-347390 A | 12/2005 |
| JP | 2006-339352 A | 12/2006 |
| JP | 2007-281043 A | 10/2007 |
| JP | 2008-016599 A | 1/2008 |
| JP | 2010-051660 A | 3/2010 |
| JP | 2010-183324 A | 8/2010 |

OTHER PUBLICATIONS

International Search Report issued in corresponding application No. PCT/JP2011/080528, completed Jan. 18, 2012 and mailed Jan. 31, 2012.

* cited by examiner

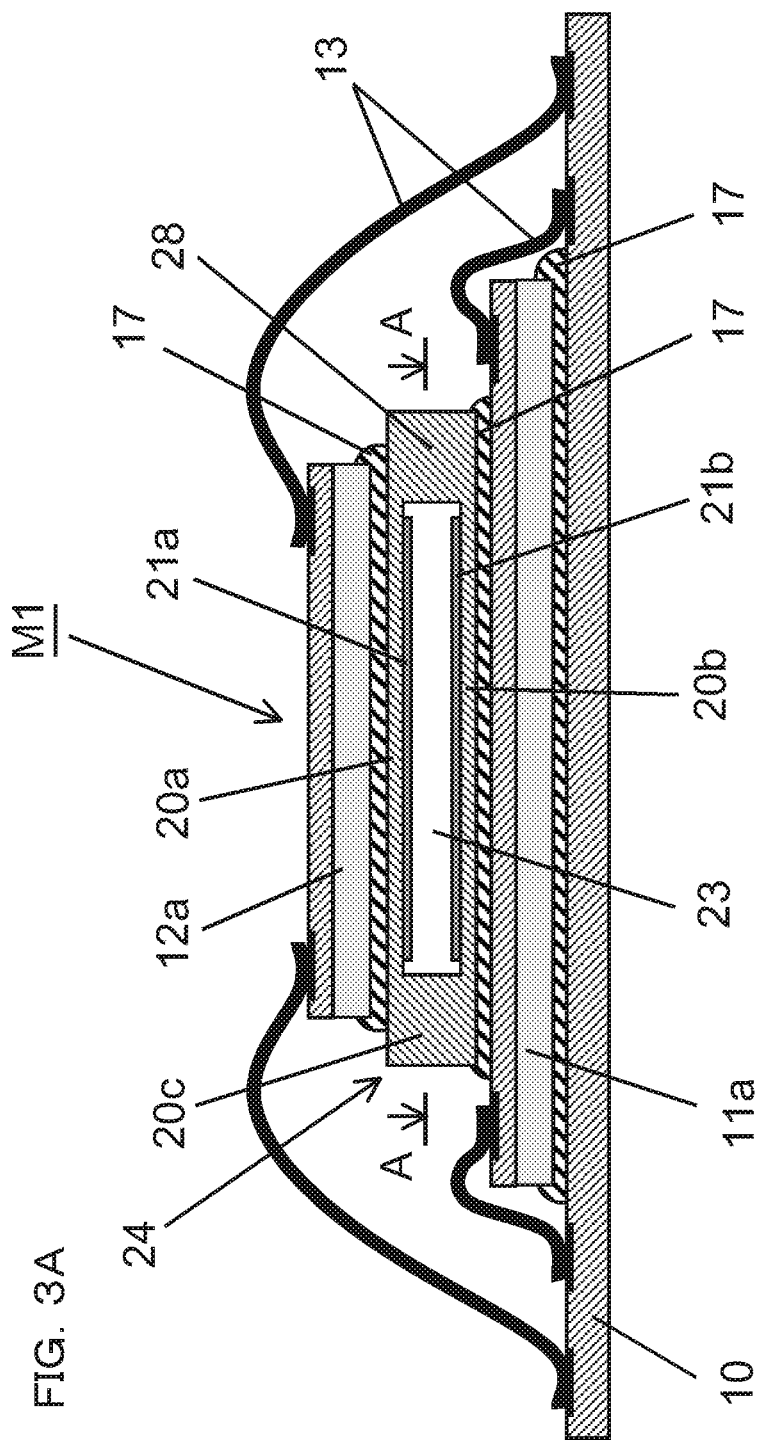

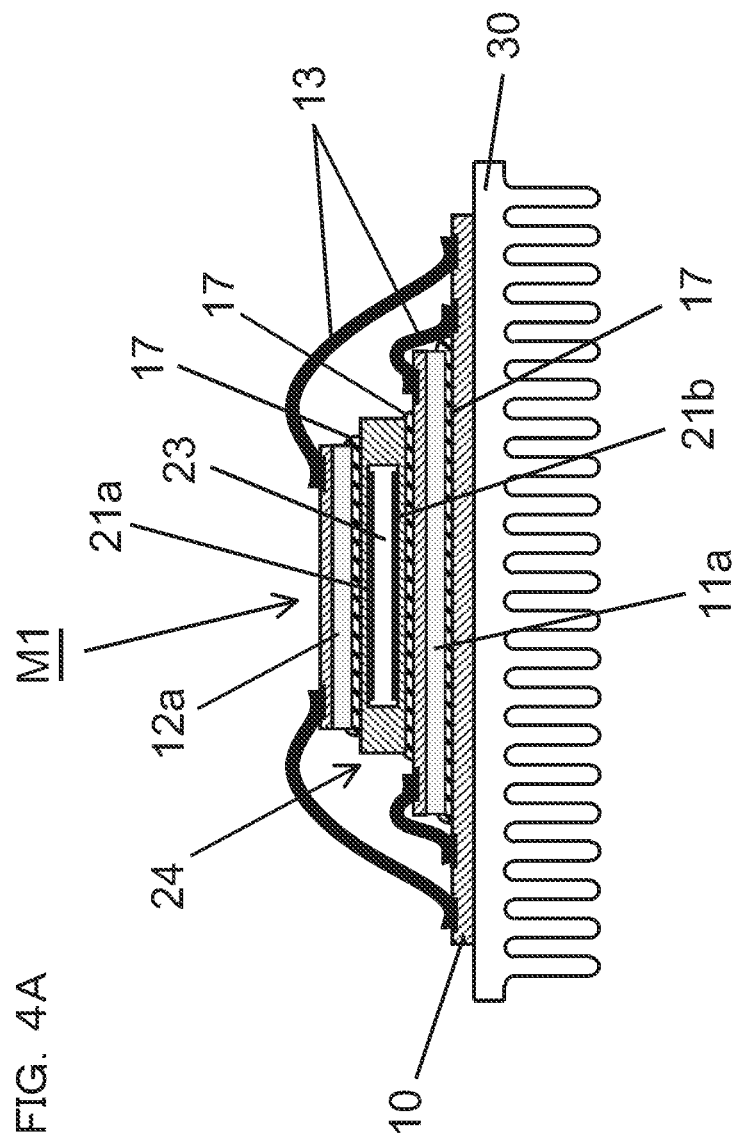

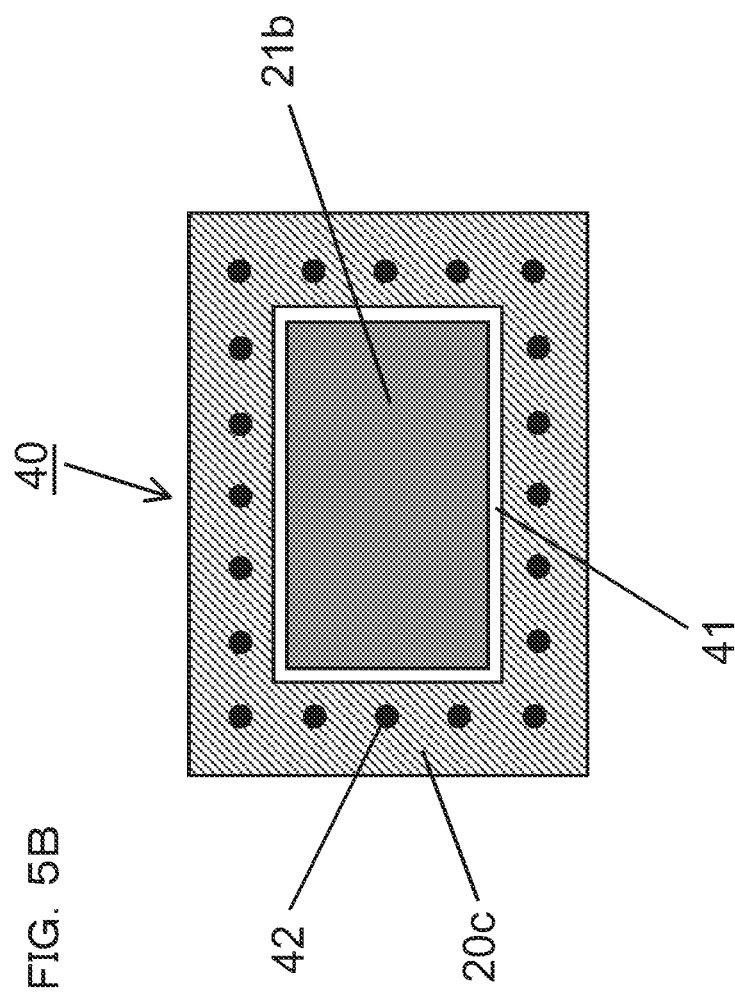

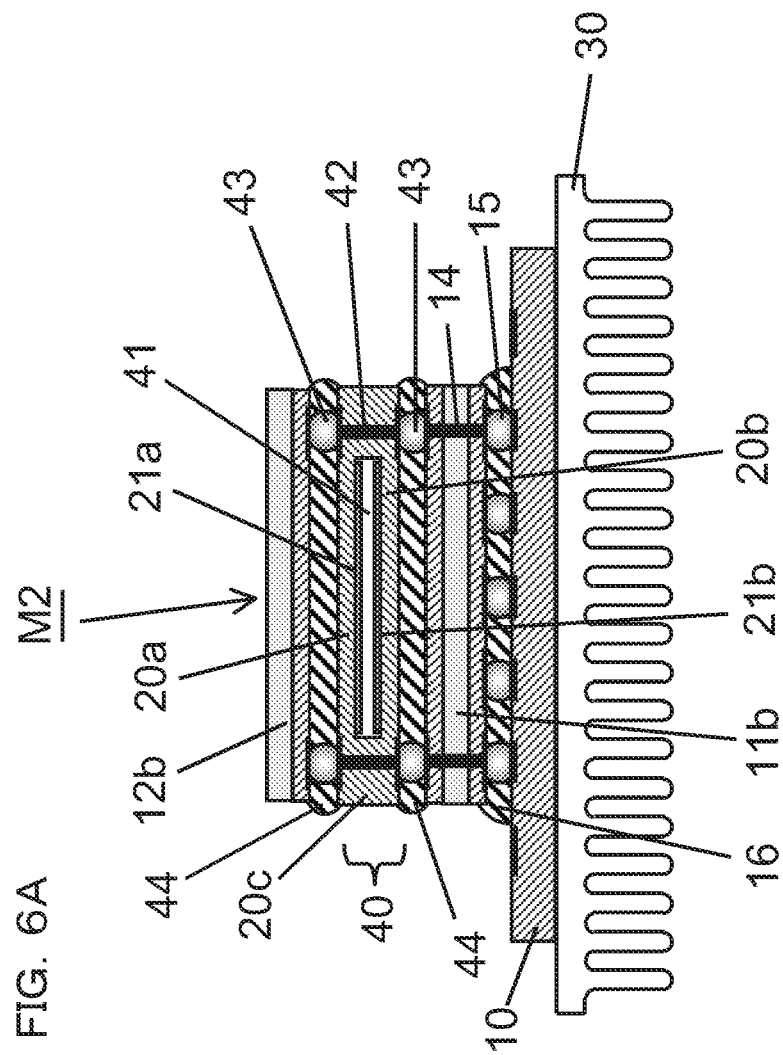

INTERPOSER AND SEMICONDUCTOR MODULE USING THE SAME

This is a National Phase Application in the U.S. of International Patent Application No. PCT/JP2011/080528 filed Dec. 28, 2011, which claims priority on Japanese Patent Application No. 2010-294618, filed Dec. 30, 2010. The entire disclosures of the above patent applications are hereby incorporated by reference.

TECHNICAL FIELD

The present invention relates to a mounting structure of semiconductor devices, and more particularly, to an interposer which is possible to suppress the rise in the operating temperature of a semiconductor device whose power consumption is large, thereby stabilizing the operation of the semiconductor device, and a semiconductor module using the interposer.

BACKGROUND ART

In recent years, technological advances in the semiconductor industries typified by silicon are large, regardless of industrial and consumer applications, contributing significantly to size reduction, weight reduction, price lowering, and performance advancement of equipment and systems. On the other hand, the request to improving semiconductor devices is not stopped and as a result, higher integration, higher speed, and more sophistication as well as miniaturization are expected. As a measure to meet these requirements, the dimensions of unit elements (e.g., transistors) that constitute a semiconductor device are sometimes miniaturized, thereby increasing the total number of the unit elements to be mounted. The advantage of this measure is increase in operating speed (higher speed) due to miniaturization and increase in function (or, total number reduction of semiconductor devices required) due to high integration. However, higher speed and/or higher integration increase power consumption in the interior of a semiconductor device. As a result, the risk of operation destabilization or damage of a semiconductor device itself becomes large. To reduce this risk, heat dissipation technology (or, cooling techniques) of a semiconductor device is essential.

Many techniques for lowering the operating temperature of a semiconductor device have been developed so far. For example, there is known a technique for cooling a semiconductor device where radiating fins (which are often made of aluminum alloy) are attached to a high-power semiconductor device and air flows are blown to the fins. When the power consumption is comparatively low (e.g., a few watts), this technique is resolvable. However, with the latest semiconductor devices, power consumption has become even greater and thus, the power consumption may reach 100 watts or more in a CPU of a computer or the like. For this reason, with such the high power consuming semiconductor device as described here, if heat dissipation is not sufficient, the temperature of the semiconductor device rises and as a result, thermal runaway or thermal damage may occur. Therefore, it may be said that the upper limit of operation of the semiconductor device is dominated by the heat dissipation technology.

With a "stacked module" formed by stacking a plurality of semiconductor devices, there is an advantage that higher integration can be realized comparatively easily. In such the configuration, power consumption of a semiconductor device positioned in a lower layer increases not only the temperature of this semiconductor device but also the temperature of a semiconductor device located in an upper layer with respect to this semiconductor device. Therefore, when a semiconductor device with a sensitive characteristic to its operating temperature is arranged in an upper layer of the stacked module, there is a possibility that the operation of the entire stacked module becomes unstable. For this reason, in the case of the stacked module, it is preferred that a mounting structure that no heat transfer occurs between the stacked semiconductor devices by cooling only the semiconductor device whose power consumption is large.

As a cooling technique of stacked semiconductor devices (a semiconductor module), conventionally, the mounting structure shown in FIG. 11 has ever been proposed. This figure is published in Patent Document 1 as FIG. 1A.

In FIG. 11, the chip stack 110 is formed by the stack of three semiconductor chips denoted by the reference numerals 110a, 110b, and 110c. Each of the chips 110a, 110b, and 110c comprises channels 175 formed by etching. (In FIG. 11, the reference numeral 175 denotes the typical channels.) The chip stack 110 is designed to be cooled by flowing a fluid (coolant) into the channels 175. This fluid flows in the narrow channels 175 which are formed among the stacked chips 110a, 110b, and 110c. In addition, in the case where the chips 110a, 110b, and 110c are formed by a semiconductor substrate, the thicknesses of the channels 175 are usually several hundreds micrometers or less.

The semiconductor chips 110a, 110b, and 110c are vertically interconnected with TSVs (Through Silicon Vias) indicated by the reference numeral 123.

On the other hand, in a semiconductor module, a wiring board called "interposer" has also been tucked between the stacked semiconductor devices. The required specifications for this interposer may have (1) electrically connecting paths (through electrodes, for example) between the top and bottom surface, and (2) electrical wiring layers (which are also referred to as redistribution layers) on the top or bottom surface, or both of the top and bottom surfaces. If such specifications are satisfied, it is easy to design and make the semiconductor module.

PRIOR ART

Patent Document

Patent Document 1: U.S. Patent Application Publication No. 2009/0311826.

SUMMARY OF THE INVENTION

Problems to be Resolved by the Invention

With the conventional mounting structure of a semiconductor device shown in FIG. 11, the channels 175 are formed like a "corridor including many bristling pillars", and the height of the channels 175 is several hundreds micrometers or less. Thus, it seems that a high pressure is needed to flow the fluid (refrigerant) into channel 175.

Furthermore, the flowing direction of the fluid is indicated by downward arrows and rightward arrows illustrated at positions below the reference numeral 111 in FIG. 11. The fluid introduced around the chip stack 110 along the downward arrows not only flows into the channels 175 among the chips 110a, 110b, and 110c along the rightward arrows but also flows around the chips 110a, 110b, and 110c. Taking the fact that the height of the channels 175 is low and a wide space exists around the chips 110a, 110b, and 110c into consideration, it is difficult to pour the fluid into only the channels 175, and a large part of the fluid flows along the periphery of the chips 110a, 110b, and 110c. Moreover, since the shape (the shape along the flowing direction of the fluid) of the channels 175 of the chips 110a, 110b, and 110c are different from each other, it is difficult to realize a uniform flow of the fluid in all the channels 175 formed in the respective chips 110a, 110b, and 110c.

For this reason, with the conventional mounting structure shown in FIG. 11, it is not always easy to realize sufficient cooling (or, radiation from the chips 110a, 110b, and 110c).

On the other hand, in the semiconductor module, if an interposer is sandwiched between the stacked semiconductor devices, the physical distance between semiconductor devices increases; for example, there is an advantage that the heat from the semiconductor device in the lower layer is hardly transmitted to the semiconductor device in the upper layer. However, in order to advance the aforementioned conventional mounting technique of semiconductor devices and to realize stable operation by suppressing the rise in the operating temperature of the semiconductor device having a large power consumption, a new structure of the interposer that lessens positively the thermal conduction between the semiconductor devices adjacent in the stacking direction is desired.

The present invention was created taking the aforementioned circumstances into consideration, and an object of the present invention is to provide an interposer that suppresses heat conduction more effectively between two heat sources when the interposer is placed between them.

Another object of the present invention is to provide an interposer, in a semiconductor module formed by stacking two or more semiconductor devices, which suppresses heat conduction more effectively between the adjacent semiconductor devices, suppressing the temperature rise of the semiconductor devices to result in stable operation.

Still another object of the present invention is to provide a semiconductor module that suppresses the temperature rise of stacked semiconductor devices to result in stable operation.

Other objects of the present invention not specified herein will become apparent from the following description and the accompanying drawings.

Means for Solving the Problems (1) An interposer according to the first aspect of the present invention comprises:

a body (structure) having a cavity which is maintained in vacuum; and a heat reflecting region formed on an inner wall surface of the cavity.

With the interposer according to the first aspect of the present invention, the aforementioned structure is provided and thus, when heat generated from a first heat source which is disposed on one side of the body (a semiconductor device, for example) moves in the body due to thermal conduction, the heat transfer is effectively suppressed by the cavity maintained in the vacuum state. Part of the heat conducts in the cavity; however, the heat reflecting region is formed on the inner wall surface of the cavity and therefore, most of the heat that has conducted through the cavity is reflected by the heat reflecting region and does not conduct any more. Accordingly, the amount of the heat reaching the second heat source from the first heat source by moving in the body is greatly reduced.

Conversely, due to the same reason, the amount of the heat reaching the first heat source from the second heat source by moving in the body also becomes very small.

In this way, the first and second heat sources are thermally insulated by the interposer of the present invention; thus, according to the interposer of the present invention, when this interposer is placed between two heat sources, heat conduction between these heat sources can be suppressed more effectively.

Moreover, in a semiconductor module formed by stacking two or more semiconductor devices, it is possible to suppress more effectively the heat conduction among the semiconductor devices by placing the interposer of the present invention between semiconductor devices adjacent in their stacking direction. Therefore, it is possible to suppress the temperature rise of these semiconductor devices, resulting in stable operation.

(2) In a preferred embodiment of the interposer according to the present invention, the body comprises an upper wall adjacent to a first heat source, a lower wall adjacent to a second heat source, and a side wall connecting the upper wall and the lower wall; and the upper wall, the lower wall, and the side wall defines the cavity. It is preferred that the upper wall, the lower wall, and the side wall are made of a material having a low thermal conductivity.

(3) In another preferred embodiment of the interposer according to the present invention, the heat reflecting region is formed on an inner surface of the upper wall and an inner surface of the lower wall; and the heat reflecting region is not formed on an inner surface of the side wall.

(4) In still another preferred embodiment of the interposer according to the present invention, the upper wall, the lower wall, and the side wall are made of single-crystal silicon. In this embodiment, there is an advantage that an electronic circuit or an electrical wiring layer can be easily formed on the surface and back of the interposer or on the upper and lower walls.

(5) In a further preferred embodiment of the interposer according to the present invention, the upper wall and the lower wall are made of single-crystal silicon, and the side wall is made of glass. In this embodiment, since single-crystal silicon and glass can be adhered firmly and airtightly by electrostatic bonding, the vacuum can be maintained easily.

(6) In a further preferred embodiment of the interposer according to the present invention, the upper wall and the lower wall are made of resin (e.g., material of a printed circuit board), and the side wall is made of resin (e.g., a photoresist material "SU-8.") having a high adhesion property. In this embodiment, since single-crystal silicon and glass can be adhered firmly and airtightly by electrostatic bonding, the vacuum can be maintained easily.

(7) In a further preferred embodiment of the interposer according to the present invention, the body comprises a through electrode.

(8) A semiconductor module according to the second aspect of the present invention comprises:

the interposer according to the first aspect of the present invention;

a first semiconductor device mounted on one side of the interposer; and a second semiconductor device mounted on the other side of the interposer.

With the semiconductor module according to the second aspect of the present invention, the aforementioned interposer according to the first aspect of the present invention is included, and the first semiconductor device and the second semiconductor device are mounted on the both sides of the interposer and thus, the first semiconductor device and the second semiconductor device are thermally insulated by the interposer. Therefore, it is possible to suppress more effectively the heat transfer between the first and second semiconductor devices.

Accordingly, even if a semiconductor device having a large power consumption is included, the temperature rise of the stacked semiconductor devices can be suppressed to result in stable operation.

(9) In a preferred embodiment of the semiconductor module according to the present invention, a heat sink mounted on the side of the first semiconductor device is further provided.

(10) In another preferred embodiment of the semiconductor module according to the present invention, a case that includes the first semiconductor device, and the second semiconductor device, and the interposer; and means for pressurizing and introducing a cooling fluid into the case are further provided. The case comprises an inlet for introducing the cooling fluid and an outlet for discharging the cooling fluid.

(11) In this specification, related words are defined as follows:

Semiconductor device: This indicates any semiconductor device, including the following (i) and (ii).

(i) A semiconductor chip (bare chip) which is cut out from a semiconductor wafer after the wafer process is completed. This semiconductor chip includes a so-called integrated circuit chip on which at least one semiconductor element such as a transistor and a diode is arranged.

(ii) The aforementioned semiconductor chip with a package. This packaged semiconductor chip includes a variety of packaged one, such as a ball grid array (BGA), a chip-size package (CSP), or the like.

Semiconductor module: This indicates any structure in which two or more semiconductor devices are stacked. Various interconnection methods among the respective layers constituting the stacked structure, such as wire bonding, Through Silicon Vias (TSVs), or the like are known; however the interconnection method is not limited. In this specification, a semiconductor module the layers of which are interconnected by wire bonding is termed a "bonding module", and a semiconductor module the layers of which are interconnected with through electrodes is termed a "through-electrode module".

Electronic component: This indicates any component that is also referred to as a passive element, such as a resister, a capacitor (condenser), and an inductor (coil). This may have a structure (e.g., a module resister) including a plurality of single elements (individual parts). Moreover, a sensor and an actuator having a specific function are included in the electronic component. Further, the actuator and the sensor in which a signal processing circuit and/or a driving circuit is/are integrated are also included in the electronic component.

Fluid: This indicates a gas or a liquid, which has a heat dissipating or heat exhausting effect by absorbing heat due to heat conduction. A fluid with such the function is also referred to as "refrigerant". Concrete examples are (i) fluorocarbons, non-CFC, etc. (which are frequently used and which have many types), (ii) an organic compound, such as butane and iso-butane, and (iii) an inorganic compound, such as hydrogen, helium, ammonia, water, and carbon dioxide.

(12) The heat reflecting region is not always disposed over the entire inner wall surface of the cavity. The heat reflecting region can be limited to a specified range of this inner wall surface. For example, the heat reflecting region is formed only on the upper wall and the lower wall of the cavity, and the heat reflecting region is not formed on the side wall of the cavity. Furthermore, it is also possible to avoid placing the heat reflecting region on of the peripheral portion of the upper wall (portion near the side wall).

The upper, lower, and side walls of the cavity can be formed of the same material. For example, if all of these walls are made of single crystal silicon, it is possible to form easily an electronic circuit or an electrical wiring layer on the surface and back of the interposer, or on the upper and lower walls, using a well-known integrated circuit manufacturing technology.

The upper, lower, and side walls of the cavity can be formed of different materials. For example, the upper wall and the lower wall are made of single-crystal silicon, and the side wall is made of glass. In this case, since single-crystal silicon and glass can be adhered firmly and airtightly by electrostatic bonding, the vacuum can be maintained easily. Moreover, the upper wall and the lower wall are made of resin (e.g., material of a printed circuit board), and the side wall is made of resin (e.g., a photoresist material "SU-8.") having a high adhesion property. It is preferred that the upper, lower, and side walls are made of material having low thermal conductivity.

An electronic circuit or an electrical wiring layer may be disposed on the surface and back of the interposer. An electronic circuit or an electrical wiring layer may be disposed on the inner wall surface of the cavity also. In this case, in order to avoid obstruction of the operation of the aforementioned electronic circuit or the like (for example, short circuit of the electronic circuit) by the heat reflecting region, an insulating layer needs to be disposed between the heat reflecting region and the aforementioned electronic circuit or the like.

The interposer can have a through electrode. By forming the through electrode, it is possible to transmit electrical signals from the semiconductor device disposed above the interposer to the semiconductor device disposed below the interposer.

A multi-stage semiconductor module can be constituted by using the two or more interposers. For example, the following structure may be taken: The first interposer is mounted on the surface of the first semiconductor device, the second semiconductor device is mounted on the surface of the first interposer, the second interposer is mounted on the surface of the second semiconductor device, and the third semiconductor device is mounted on the surface of the second interposer.

Advantageous Effects of the Invention

With the interposer according to the present invention, heat conduction can be suppressed more effectively between two heat sources when the interposer is placed between them. Moreover, in a semiconductor module formed by stacking two or more semiconductor devices, heat conduction between the adjacent semiconductor devices can be suppressed more effectively and as a result, the temperature rise of the semiconductor devices can be suppressed to result in stable operation.

With the semiconductor module according to the present invention, even if a semiconductor device having a large power is included, the temperature rise of the stacked semiconductor devices can be suppressed to result in stable operation.

BRIEF DESCRIPTION OF THE DRAWINGS

FIG. 3A is an explanatory cross-sectional view showing the entire structure of a semiconductor module (bonding module) according to a second embodiment of the present invention.

FIG. 4A is an explanatory cross-sectional view showing the entire structure of a semiconductor module according to a third embodiment of the present invention (in which a heat dissipating plate is attached to the semiconductor module according to the second embodiment).

FIG. 5B is an explanatory cross-sectional view taken along the line B-B in FIG. 5A, showing the structure of an interposer used for the semiconductor module according to the fifth embodiment of the present invention.

FIG. 6A is an explanatory cross-sectional view showing the entire structure of a semiconductor module according to a sixth embodiment of the present invention (in which a heat dissipating plate is attached to the semiconductor module according to the fifth embodiment).

MODE FOR CARRYING OUT THE INVENTION

Hereinafter, preferred embodiments of an interposer and a semiconductor module using the same according to the present invention will be described with reference to the accompanying drawings.

Figure 1A:
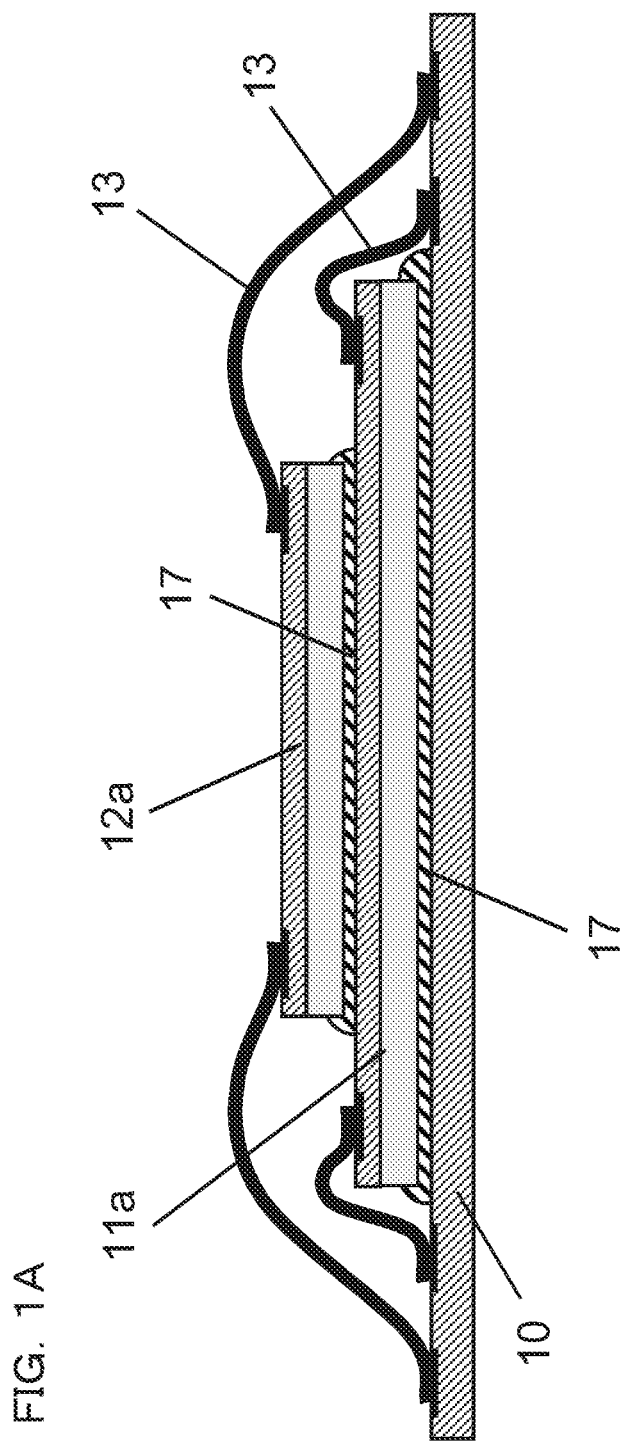
FIG. 1A is an explanatory view showing the typical structure of a semiconductor module using wire bonding (bonding module).
Figure 1B:
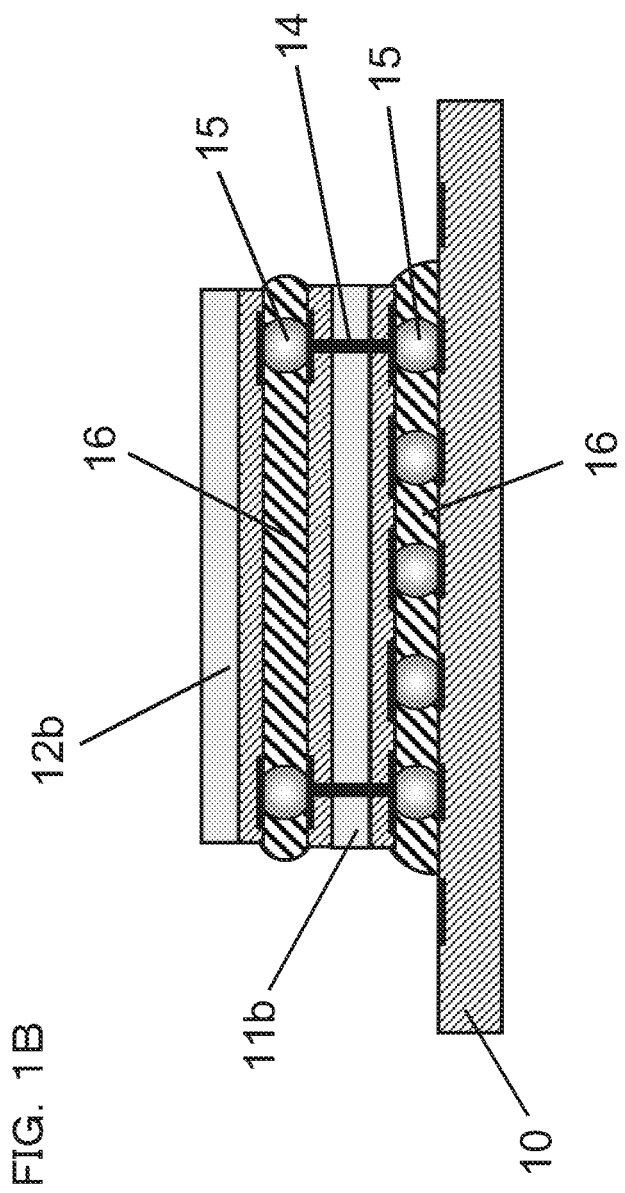
FIG. 1B is an explanatory view showing the typical structure of a semiconductor module using through electrodes (through-electrode module).

The typical structure of a semiconductor module in which electrical connection is performed by bonding thin metal wires (bonding module) is shown in FIG. 1A, and the typical structure of a semiconductor module in which electrical connection is performed with through electrodes (through-electrode module) is shown in FIG. 1B. In any of these structures, two semiconductor devices (here, they are chi-shaped semiconductor devices, i.e., semiconductor chips) are stacked to form a two-layered structure.

With the semiconductor module of FIG. 1A, a first semiconductor device 11a is fixed on a substrate 10 which is made of a resin, ceramic, semiconductor, or the like with an adhesive 17, and a second semiconductor device 12a is fixed on the first semiconductor device 11a with the adhesive 17. Electrical connection of the first and second semiconductor devices 11a and 12a to the substrate 10 is carried out by using bonding wires 13.

With the semiconductor module of FIG. 1B, a first semiconductor device 11b is fixed on a substrate 10 which is made of a resin, ceramic, semiconductor, or the like with conductive balls 15, and a second semiconductor device 12b is fixed on the first semiconductor device 11b with conductive balls 15. The surface and back of the first semiconductor device 11a are electrically interconnected with through electrodes 14 penetrating through the inside of the first semiconductor device 11a. Electrical connection between the first semiconductor device 11a and the second semiconductor device 11b and electrical connection between the first semiconductor device 11a and the substrate 10 are both carried out using conductive balls 15. Further, between the substrate 10 and the first semiconductor device 11b, and between the first semiconductor device 11b and the second semiconductor device 12b, a filler 16 is filled to increase the connection strength with the conductive balls 15.

The semiconductor modules shown in FIGS. 1A and 1B have advantages and disadvantages, respectively.

With the semiconductor module (bonding module) of FIG. 1A, since the first semiconductor device 11a and the second semiconductor device 12a are simply stacked and then, electric connection is carried out by bonding wire, developing new technologies is unnecessary. However, it is required that the height of the first semiconductor device 11a is larger than that of the second semiconductor device 12a, and that wire bonding can be carried out between the different height positions. There is a semiconductor module by stacking semiconductor devices to form three or more layers by this approach. In the case where a cooling fluid (refrigerant) is flowed around the periphery of the semiconductor module of FIG. 1A using the wire bonding, some protection is necessary so that the bonding wires (thin metal wires) 13 may not be broken.

With the semiconductor module (through-electrode module) of FIG. 1B, the technology for embedding the through electrodes 14 in the underlying first semiconductor device 11b, the manufacturing technology of mounting, melting and re-solidifying a lot of the conductive balls 15, and the technology of pouring the filler into between the substrate 10 and the first semiconductor device 11b and into the narrow space between the first and second semiconductor devices 11b and 12b are necessary. With this semiconductor module, since all the regions relating electrical wiring are located in the first or second semiconductor device 11b or 12b or are covered with the filler 16, this semiconductor module is seldom destroyed even if the flow of the cooling (coolant) exists.

[Interposer of First Embodiment]

Figure 2A:
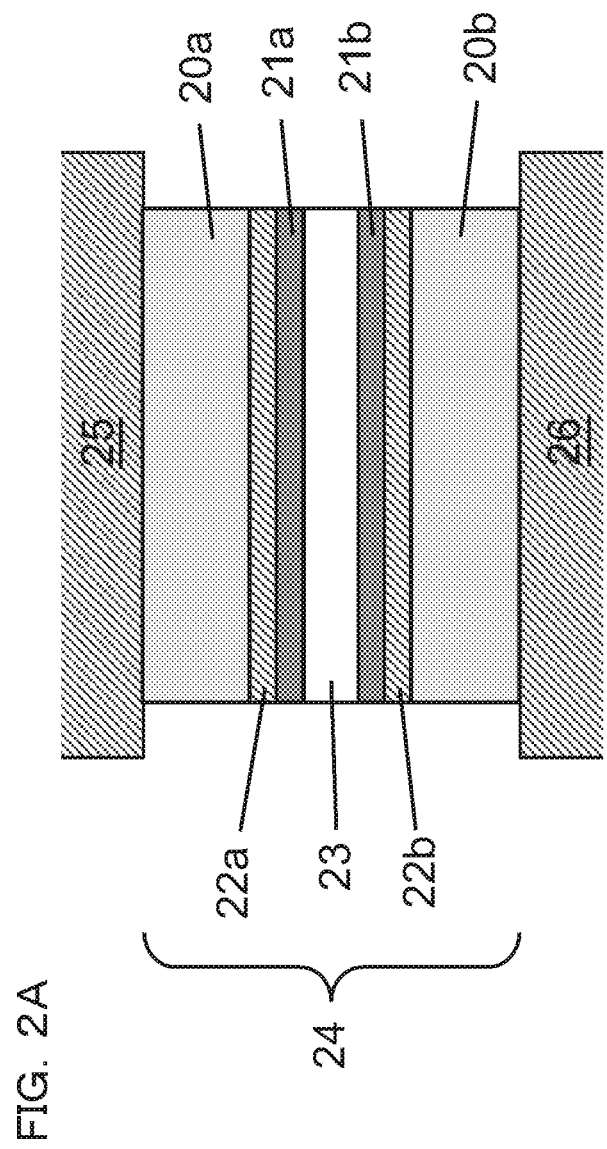
FIG. 2A is a partial, explanatory cross-sectional view showing the structure of an interposer according to a first embodiment of the present invention.
Figure 2B:
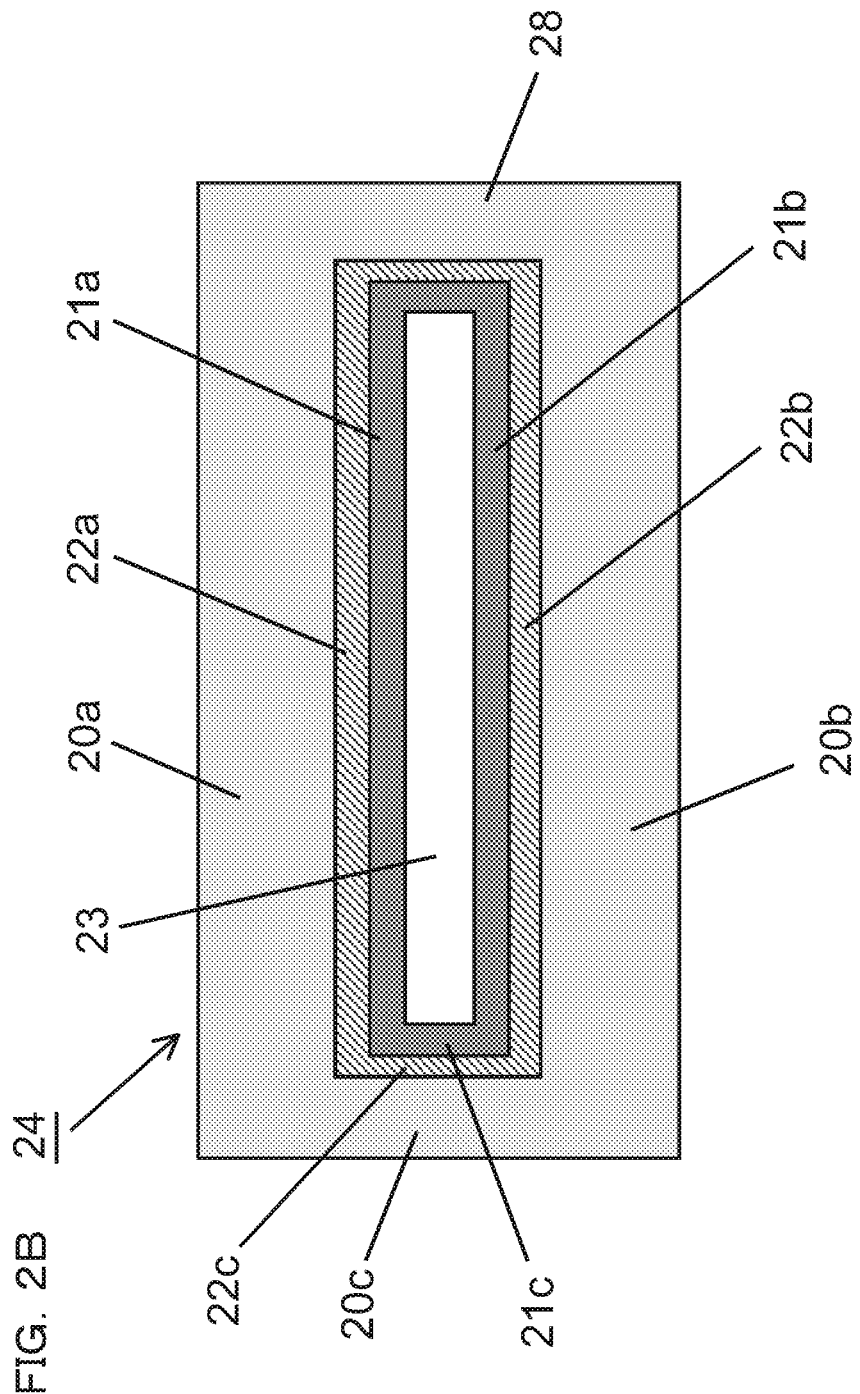
FIG. 2B is an explanatory cross-sectional view showing the entire structure of the interposer according to the first embodiment of the present invention.

An interposer according to a first embodiment of the present invention is shown in FIGS. 2A and 2B. FIG. 2A is a partial cross-sectional view showing the structure of a main part of this interposer, and FIG. 2B is an explanatory cross-sectional view showing the entire structure of the same interposer.

The Interposer 24 of the first embodiment of the present invention comprises a body having an upper wall 20a, a lower wall 20b, and a side wall 20c that interconnects the upper wall 20a and the lower wall 20b, wherein a cavity 23 the inside of which is maintained in vacuum is formed in the body. The overall shape of the interposer 24 is like a hollow plate. The upper and lower walls 20a and 20b form the ceiling and floor of the cavity 23, respectively. The side wall 20c forms a surrounding wall that connects the floor and ceiling of the cavity 23.

The reference numerals 25 and 26 shown in FIG. 2A denote heat sources with which the upper wall 20a and the lower wall 20b are in contact, respectively. Examples of the heat sources 25 and 26 are semiconductor devices that constitute the semiconductor module.

Insulating layers 22a and 22b are formed on the inner surfaces of the upper and lower walls 20a and 20b, respectively. An insulating layer 22c is formed on the inner surface of the frame-shaped side wall 20c also. Thus, the whole of the inner surfaces of the upper, lower, and side walls 20a, 20b and 20c (that is, the inner wall surface of the cavity 23) is covered with the insulation layers 22a, 22b, and 22c.

Heat reflecting layers 21a and 21b are formed inside the insulating layers 22b and 22a, respectively. A heat reflecting layer 21c is formed inside the insulating layer 22c. Therefore, the entire surface of the insulating layers 22a, 22b, and 22b is covered heat reflective layers 21a, 21b, and 21c. Since the heat reflecting layers 21a, 21b, and 21c form thermally reflecting regions, respectively, in the configuration of FIG. 2B, it can be said that all the surfaces of the insulating layers 22a, 22b, and 22c are heat reflecting regions.

In this way, the inner wall surface of the body that forms the cavity 23 (that is, the inner surfaces of the upper, lower, and side walls 20a, 20b, and 20c) is all covered with two layers of the insulating layers 22a, 22b, and 22c and the heat reflecting layers 21a, 21b, and 21c.

The heat reflecting layers 21a and 21b are provided with the function of reflecting the heat entering from above and below through the upper and lower walls 20a and 20b, which is formed from a metal thin film or the like in many cases. For example, a thin film of aluminum or gold may be used; it is preferable that this thin film has a mirror surface, but it may not be specular. Further, the heat reflecting layers 21a and 21b are preferably disposed over the entire inner surface of the upper wall 20a (lower surface in FIGS. 2A and 2B) and the entire inner surface of the lower wall 20b (upper surface in FIGS. 2A and 2B); however the present invention is not limited to this. For example, the heat reflecting layer 21a may be disposed only on a designated area of the inner surface of the upper wall 20a. The same is true for the lower wall 20b.

It is preferred that the upper and lower walls 20a and 20b are made of material having a small thermal conductivity; however the present invention is not limited to this. If the upper and lower walls 20a and 20b are made of single crystal silicon, and an electronic circuit including electronic components and transistors or an electric wiring layer is disposed on the each outer surface (upper surface in FIGS. 2A and 2B) of the upper and lower walls 20a and 20b is formed, it is preferred that insulating layers 22a and 22b are respectively disposed. The insulating layers 22a and 22b have a role of preventing short-circuit of the electronic circuit or the like due to the heat reflecting layers 21a and 21b (which are conductive since these are thin metal films). If such the need is not present, the insulating layers 22a and 22b can be omitted.

Since the cavity 23 is maintained in vacuum, the thermal conductivity of the cavity 23 is very small, as known well.

In FIG. 2A, the heat generated by the heat source 25 placed at the upper position (1) is transmitted to the inside of the upper wall 20a and the insulating layer 22a to reach the surface of the heat reflecting layer 21a. However, most of this heat is reflected by the surface of the heat reflecting layer 21a and go back towards the heat source 25. (2) A small amount of the heat that has passed through the heat reflecting layer 21a without reflection at the surface of the heat reflecting layer 21a is radiated into the cavity 23 that is maintained in vacuum. However, the thermal conductivity of the vacuum is small and therefore, the heat that reaches the heat reflecting layer 21b through the interior of the cavity 23 is further reduced. (3) The heat that has reached the heat reflecting layer 21b through the interior of the cavity 23 is reflected by the surface of the heat reflecting layer 21b. Thus, the heat passing through the heat reflecting layer 21b is reduced furthermore. As a result, the amount that reaches the heat source 26 out of the heat generated by the heat source 25 is at a critically low. Since the heat generated by the heat source 26 is in a similar situation, the amount that reaches the heat source 25 is at a critically low.

As described above, the heat sources 25 and 26 are "thermally insulated" from each other by the interposer 24. For this reason, even if, for example, the heat source 26 is a semiconductor device consuming large power and the heat source 25 is a semiconductor device having a sensitive characteristic to heat, the effect of the heat source 26 to the heat source 25 can be drastically reduced by the interposer 24.

The side walls 20c that forms the body of the interposer 24 is an essential structural element to form the cavity 23 which is maintained in vacuum; however, the side walls 20c forms a thermal conduction path between the upper wall 20a and the lower wall 20b that should be thermally insulated. Therefore, the side wall 20c is preferably designed in smaller thickness (thinner) as much as possible. The side walls 20c may be formed by some different material (which has preferably small thermal conductivity) from that of the upper and lower walls 20a and 20b. If there is no need to insulate the inner surface of the side wall 20c, the insulating layer 22c formed on the inner surface of the side wall 20c can be omitted.

In the configuration of FIG. 2B, the heat reflecting layers 21a, 21b and 21c are placed on the entire inner surface of the body that forms the cavity 23; however, the heat reflecting layers 21a, 21b and 21c may be limited in a specified area of the inner surface of the body. For example, the heat reflecting layers 21a and 21b may be arranged only on the inner surface of the upper and lower walls 20a and 20b that form respectively the ceiling and floor of the cavity 23, and the heat reflecting layer 21c on the inner surface of the side wall 20c that forms the surrounding wall of the cavity 23 may be omitted. Also, the heat reflecting layers 21a and 21b do not need to be arranged on the entire inner surface of the upper and lower walls 20a and 20b, and the heat reflecting layers 21a and 21b can be disposed in a limited, specified area. For example, like the configuration shown in FIGS. 3A and 3B described later, the heat reflecting layers 21a and 21b can be omitted in the areas of the upper and lower walls 20a and 20b which are close to the side wall 20c, respectively.

With the interposer 24 according to the first embodiment of the present invention, since the aforementioned configuration is provided, when the heat generated from the heat source 25 (a semiconductor device, for example) disposed on one side of the body moves in the body due to conduction, the heat transfer is effectively suppressed by the cavity 23 held in vacuum. Part of the heat conducts in the inside of the cavity 23; however, the heat reflective layer 21a, 21b and 21c (all of which function as a heat reflecting region) are formed on the inner wall surface of the cavity 23 and thus, most of the heat that has been conducted through the cavity 23 is reflected by the heat reflective layer 21a, 21b and 21c and does not conduct any more. Accordingly, the amount of the heat that reaches the heat source 26 from the heat source 25 through the body greatly reduced.

On the other hand, for the same reason, the amount of the heat generated from the heat source 26 to reach the heat source 25 through the body is at a critically low.

In this way, the heat sources 25 and 26 are thermally insulated by the interposer 24 according to the first embodiment. Thus, when the interposer 24 is placed between the two heat sources 25 and 26, the heat transfer between the heat sources 25 and 26 can be suppressed more effectively.

If the interposer 24 is placed between adjoining semiconductor devices in the stacking direction in a semiconductor module formed by stacking two or more semiconductor devices, thermal conduction between the semiconductor devices can be suppressed more effectively. Therefore, the temperature rise of the semiconductor devices can be suppressed to result in stable operation.

[Semiconductor Module of Second Embodiment, Bonding Module]

Figure 3B:
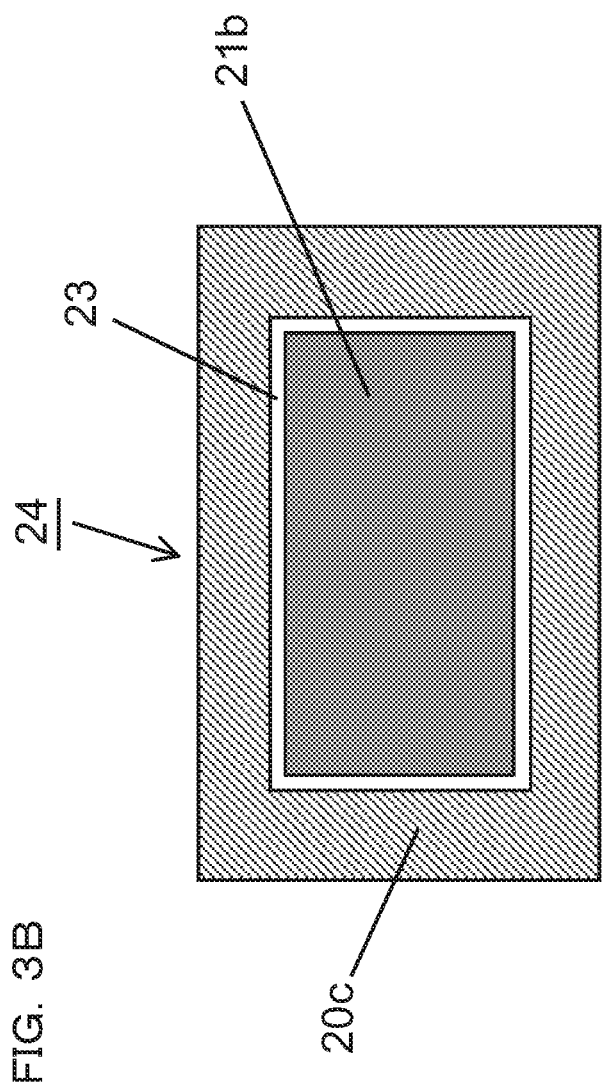
FIG. 3B is an explanatory cross-sectional view taken along the line A-A in FIG. 3A, showing the structure of an interposer used for the semiconductor module according to the second embodiment of the present invention.

A semiconductor module of a second embodiment of the present invention is shown in FIGS. 3A and 3B. FIG. 3A is a cross-sectional view showing the entire structure of this semiconductor module, and FIG. 3B is a cross-sectional view taken along the line A-A of this semiconductor module in FIG. 3A.

The semiconductor module M1 of the second embodiment is an example in which the interposer 24 of the aforementioned first embodiment is applied to the bonding module shown in FIG. 1A.

As shown in FIGS. 3A and 3B, with the semiconductor module M1, the interposer 24 is mounted on the surface of the first semiconductor device 11a fixed on the substrate 10 by the adhesive 17, and the second semiconductor device 12a is mounted on the surface of the interposer 24. The interposer 24 is fixed to the surface of the first semiconductor device 11a with the adhesive 17. The second semiconductor device 12a is fixed to the surface of the interposer 24 with the adhesive 17. Electrical connections among the first and second semiconductor devices 11a and 12a and the substrate 10 are all carried out with the bonding wires 13.

The interpose 24 comprises the cavity 23 held in vacuum. The heat reflecting layers 21a and 21b are respectively disposed on the upper wall 20a (ceiling) and the lower wall 20b (floor) that form the inner wall of the cavity 23. The heat reflecting layers 21a selectively covers the inner surface of the lower wall 20b except for its peripheral area (the area of thin rectangular frame-like shape in the vicinity of the side wall 20c). Similarly, the heat reflective layer 21b also covers selectively the inner surface of the upper wall 20a except for its peripheral area (the area of thin rectangular frame-like shape in the vicinity of the side wall 20c).

With the semiconductor module M1 according to the second embodiment having the above configuration, because the interposer 24 is disposed between the first and second semiconductor devices 11a and 12a, the first and second semiconductor devices 11a and 12a are thermally insulated (blocked) by the cavity 23 maintained in vacuum inside the interposer 24. That is, the heat generated in the first semiconductor device 11a is not transmitted to the second semiconductor device 12a, and the heat generated in the second semiconductor device 12a also is not transmitted to the first semiconductor device 11a. For this reason, it is possible to suppress more effectively the heat transfer between the first and second semiconductor devices 11a and 12a. Therefore, even if a semiconductor device having large power consumption is included, the stacked semiconductor devices 11a and 12a can be operated stably by suppressing their temperature rises.

However, part of the heat generated in the first semiconductor device 11a is transmitted to the second semiconductor device 12a through the side wall 20c, and part of the heat generated in the second semiconductor device 12a is also transferred to the first semiconductor device 11a through the side wall 20c. As a countermeasure to reduce the heat transfer through the side wall 20c, as described above, to reduce the thickness of the side wall 20c or to form the side wall 20c by a different material (a material whose thermal conductivity is as small as possible is preferred) from that of the first and second semiconductor devices 11a and 12a.

With the semiconductor module M1 according to the second embodiment, the heat generated in the first semiconductor device 11a is not transmitted to the second semiconductor device 12a, and the heat generated in the second semiconductor device 12a also is not transmitted to the first semiconductor device 11a. (More precisely, it is "difficult to be transmitted.") However, if it is assumed that the heat dissipation from the second semiconductor device 12a (e.g., the heat dissipation into the space above the second semiconductor devices 12a) and the heat dissipation from the first semiconductor device 11a (e.g., thermal conduction to the lower space via the substrate 10) are not present, heat transfer takes place in such a way that the temperatures of the two semiconductor devices 11a and 12a are equal to each other with time. That is, the thermal insulation function of the interposer 24 is no longer utilized as time passes. In reality, the aforementioned heat transfer and heat dissipation are done and thus, the above assumption does not hold; but it is possible to enhance the thermal insulating effect of the interposer 24 by adopting a configuration that actively promotes the heat conduction and the heat dissipation from the first and second semiconductor devices 11a and 12a. Hereinafter, examples of this configuration will be shown as third and fourth embodiments.

[Semiconductor Module of Third Embodiment, Bonding Module]

A semiconductor module according to a third embodiment of the present invention is shown in FIG. 4A. This semiconductor module is obtained by mounting a heat dissipating plate 30 to the semiconductor module M1 of the second embodiment described above. The heat dissipating plate 30 is fixed in close contact with the back (lower surface) of the substrate 10.

The heat generated in the first semiconductor device 11a is transferred to the heat dissipating plate 30 by way of the substrate 10, and radiated to the ambient space from many radiating fins of the plate 30. Because of such the heat dissipating function, the temperature rise of the first semiconductor device 11a is suppressed and as a result, the temperature rise of the second semiconductor device 12a is suppressed.

With the semiconductor module of the third embodiment, in this way, the heat generated in the first semiconductor device 11a is taken away from the periphery of the first semiconductor device 11a with the heat dissipating plate 30 and thus, the temperature rise of the first semiconductor device 11a is suppressed. Further, conduction of the heat generated in the first semiconductor device 11a to the second semiconductor device 12a is prevented by the interposer 24 having the cavity 23. The effectiveness of the thermal insulation effect of the interposer 24 is enhanced accordingly.

Since such the configuration is adopted, even if the second semiconductor device 12a comprises a sensitive characteristic to its operating temperature, the temperature rise of the second semiconductor device 12a is suppressed and therefore, the operation temperature of the second semiconductor device 12a can be lowered and constant. As a result, a semiconductor module with stable operation can be realized.

[Semiconductor Module of Fourth Embodiment, Bonding Module]

Figure 4B:
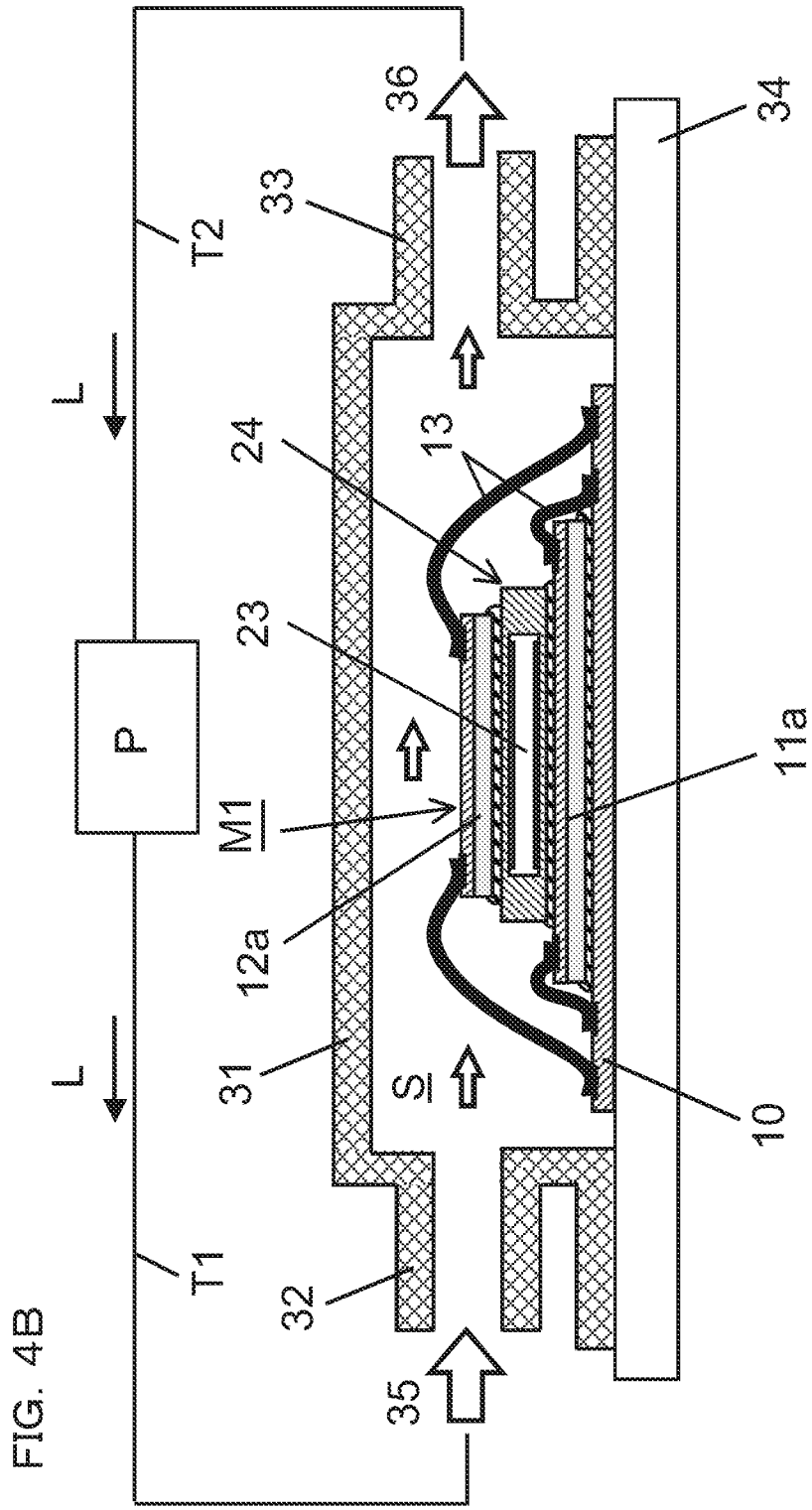
FIG. 4B is an explanatory cross-sectional view showing the entire structure of a semiconductor module according to a fourth embodiment of the present invention (in which the semiconductor module according to the second embodiment is contained in a case and a cooling fluid is supplied therein).

A semiconductor module according to a fourth embodiment of the present invention is shown in FIG. 4B. This semiconductor module is obtained by mounting a case 31 to the semiconductor module M1 of the second embodiment described above. The case 31 has a box shape of an approximately rectangular parallelepiped whose lower surface is opened, and is fixed closely to the surface (upper surface) of the substrate 10. The case 31 covers (includes) the whole semiconductor module M1.

The substrate 10 and the case 31 constitute an inner space S of an approximately rectangular parallelepiped, and the semiconductor module M1 is located in the inner space S. The case 31 has an inlet 32 for introducing a heat-absorbing fluid L into the inner space S from the outside and an outlet 33 for discharging the fluid L from the inner space S to the outside. The inner space S is a closed space with the exception of the inlet and outlet 32 and 33.

An arrow 35 indicates the flow of the fluid L flowing into the inlet 32 from the outside. An arrow 36 indicates the flow of the fluid L to flow to the outside from the outlet 33. The fluid L flows into the inlet 32 as shown by the arrow 35 and enters the inner space S. After flowing through the inner space S, the fluid L flows out from the outlet 33 as shown by the arrow 36.

One end of a tube T1 and one end of a tube T2, which are made of plastic or metal, are connected to the inlet 32 and the outlet 33, respectively. The other end of the tube T1 and the other end of the tube T2 are respectively connected to the delivery port and the return port of a pump P that applies a predetermined pressure to the fluid L and that supplied the fluid L thus pressurized to the inlet 32. As the pressurizing mechanism of the fluid L, any one that applies a predetermined pressure to the fluid L and that supplied the fluid L thus pressurized to the inlet 32 is applicable. Any one other than the pump can also be used for this purpose.

The heat-absorbing fluid L is fed into the inner space S of the case 31 to have a predetermined pressure with the pump P via a tube T1. The fluid L thus fed is returned to the pump P via a tube T2. In this way, the fluid L is circulated from the pump P,→the tube T1,→the inner space S,→the tube T2, and→the pump P. The fluid L absorbs the heat generated from the semiconductor module M1 in the inner space S, and naturally dissipates the heat thus absorbed while flowing in the outside. In this way, the heat generated from the semiconductor module M1 is allowed to dissipate to the outside of the case 31. For this reason, the liquid L is cooled when it is fed to the inlet 32.

It is preferred that the fluid L has a property that absorbs the heat generated by the semiconductor module M1. Examples of such the fluid L are (1) Freon-CFC-free acids, (2) an organic compound such as butane, and iso-butane, and (3) an inorganic compound such as hydrogen, helium, ammonia, water, and carbon dioxide. These are all referred as "refrigerant"; however, in the fourth embodiment, the fluid L is not to be limited to the type of refrigerants.

The heat generated in the first semiconductor device 11a in the lower layer is transmitted to the fluid L and is dissipated to the outside from the outlet 33 by the flow of the fluid L. Due to this radiating function, the temperature rise of the first semiconductor device 11a is suppressed and as a result, the temperature rise of the second semiconductor device 12a in the upper layer is suppressed.

With the semiconductor module of the fourth embodiment, unlike the aforementioned third embodiment, the heat is taken away from the whole of the semiconductor module M1 and thus, the temperature rise of the heat-generating first semiconductor device 11a is suppressed. Further, conduction of the heat generated in the first semiconductor device 11a to the second semiconductor device 12a is prevented by the interposer 24 having the cavity 23. The effectiveness of the thermal insulation effect of the interposer 24 is enhanced accordingly.

Since such the configuration is adopted, even if the second semiconductor device 12a comprises a sensitive characteristic to its operating temperature, the temperature rise of the second semiconductor device 12a is suppressed and therefore, the operation temperature of the second semiconductor device 12a can be lowered and constant. As a result, a semiconductor module with stable operation can be realized.

[Interposer of Fifth Embodiment, Through-Electrode Module]

Figure 5A:
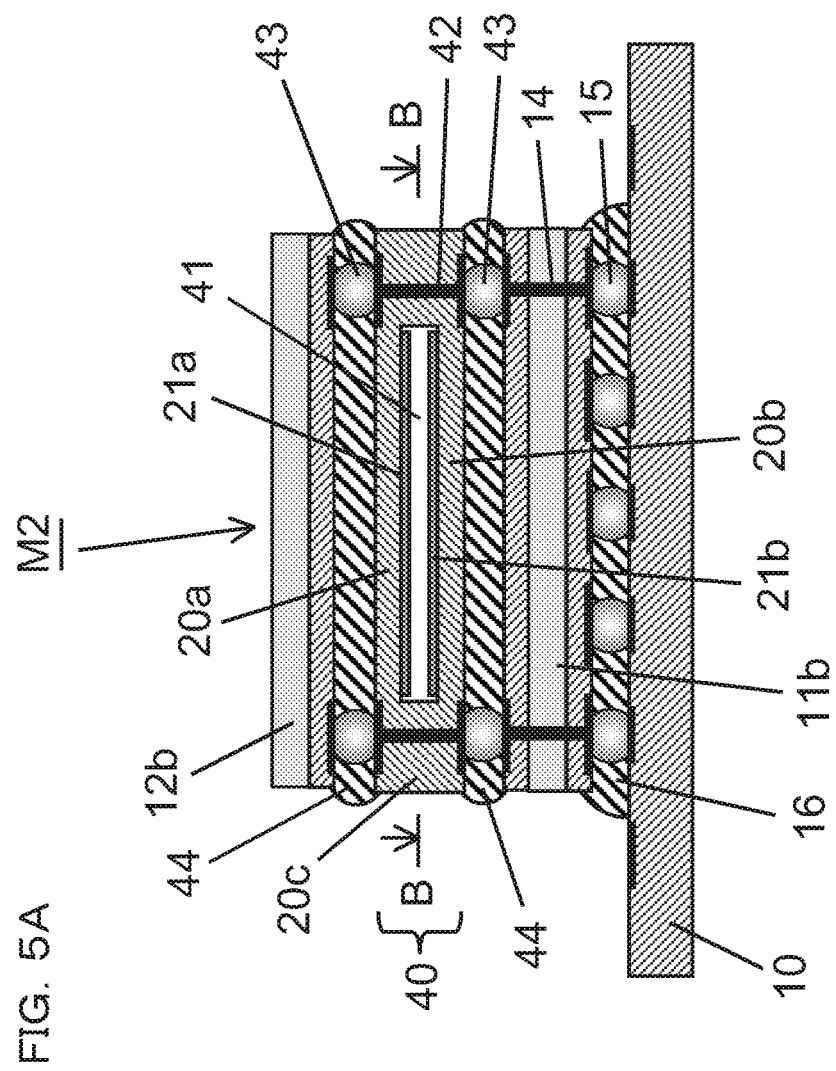
FIG. 5A is an explanatory cross-sectional view showing the entire structure of a semiconductor module (through-electrode module) according to a fifth embodiment of the present invention.

A semiconductor module of a fifth embodiment of the present invention is shown in FIGS. 5A and 5B. FIG. 5A is a cross-sectional view showing the entire structure of this semiconductor module, and FIG. 5B is a cross-sectional view taken along the line B-B of this semiconductor module in FIG. 5A.

The semiconductor module M2 of the fifth embodiment is an example in which the interposer 24 of the aforementioned first embodiment is applied to the through-electrode module shown in FIG. 1B.

As shown in FIGS. 5A and 5B, with the semiconductor module M2, the interposer 40 is mounted on the surface of the first semiconductor device 11b fixed on the substrate 10 by the conductive balls 15, and the second semiconductor device 12b is mounted on the surface of the interposer 40. The interposer 40 is fixed to the surface of the first semiconductor device 11b with the conductive balls 15. The second semiconductor device 12b is fixed to the surface of the interposer 40 with the conductive balls 15.

The interpose 40 comprises the cavity 43 held in vacuum. The heat reflecting layers 21a and 21b are respectively disposed on the upper wall 20a (ceiling) and the lower wall 20b (floor) that form the inner wall of the cavity 43. The heat reflecting layers 21a selectively covers the inner surface of the lower wall 20b except for its peripheral area (the area of thin rectangular frame-like shape in the vicinity of the side wall 20c). Similarly, the heat reflective layer 21a also covers selectively the inner surface of the upper wall 20a except for its peripheral area (the area of thin rectangular frame-like shape in the vicinity of the side wall 20c).

Through electrodes 42 for electrically connecting the surface and back of the interposer 40 are formed in the interposer 40. However, the insulating film formed between the elements that constitute the interposer 40 is not shown. Electrical connection between the lower surface (back) of the interposer 40 and the first semiconductor device 11b is made of the conductive balls 43. Electrical connection between the upper surface (surface) of the interposer 40 and the second semiconductor device 12b is made of the conductive balls 43.

On the surface and back of the interposer 40, only the electrode pads that are electrically connected to the conductive balls 43 and that are electrically connected to the through electrodes 42 for surface and back connection are depicted;

but the present invention is not limited this. For example, one or more electrical wiring layers may be provided on the surface or back of the interposer 40, and the interconnections from the second semiconductor device 12b may be re-routed so as to connect the first semiconductor device 11b. With this configuration, it is preferred that the interposer 40 is made of single crystal silicon; however, the present invention is not limited this. For example, one or more electrical wiring layers may be provided on the interposer 40 made of plastic.

With the semiconductor module M2 according to the fifth embodiment having the above configuration also, because the interposer 40 is disposed between the first and second semiconductor devices 11b and 12b, the first and second semiconductor devices 11b and 12b are thermally insulated (blocked) by the cavity 41 maintained in vacuum inside the interposer 40. That is, the heat generated in the first semiconductor device 11b is not transmitted to the second semiconductor device 12b, and the heat generated in the second semiconductor device 12b also is not transmitted to the first semiconductor device 11b. (More precisely, it is "difficult to be transmitted.") For this reason, it is possible to suppress more effectively the heat transfer between the first and second semiconductor devices 11b and 12b. Therefore, even if a semiconductor device having large power consumption is included, the stacked semiconductor devices 11b and 12b can be operated stably by suppressing their temperature rises.

Moreover, like the above-mentioned second embodiment, part of the heat generated in the first semiconductor device 11b is transmitted to the second semiconductor device 12b through the side wall 20c, and part of the heat generated in the second semiconductor device 12b also is transmitted to the first semiconductor device 11b through the side wall 20c; However, the through electrodes 42 are provided in the fifth embodiment and thus, the thermal insulating property is inferior to the aforementioned second embodiment. This is because the materials with high conductivity which are suitable for the through electrodes 42 have generally high thermal conductivity also and thus, thermal conduction occurs via the through electrode 42. However, by reducing the size (cross sectional area) of the through electrodes 42, it is possible to prevent deterioration of thermal insulation property.

Similar to the above-mentioned second embodiment, it is possible to enhance the thermal insulating effect of the interposer 40 by adopting a configuration that actively promotes the heat conduction and the heat dissipation from the first and second semiconductor devices 11b and 12b. Hereinafter, examples of this configuration will be shown as sixth and seventh embodiments.

[Interposer of Sixth Embodiment, Through-Electrode Module]

Figure 6B:
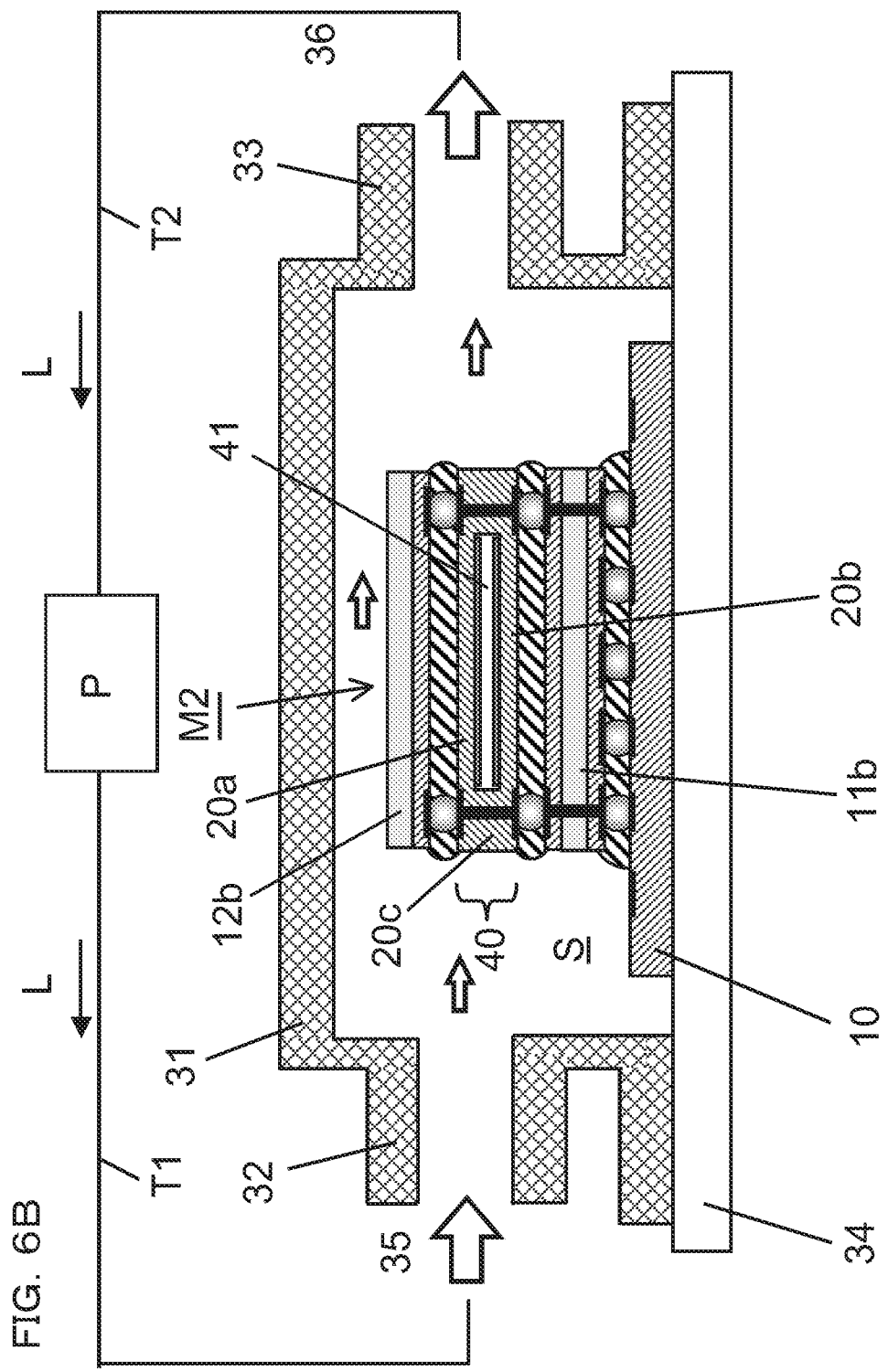
FIG. 6B is an explanatory cross-sectional view showing the entire structure of a semiconductor module according to a seventh embodiment of the present invention (in which the semiconductor module according to the fifth embodiment is contained in a case and a cooling fluid is supplied therein).

A semiconductor module according to a sixth embodiment of the present invention is shown in FIG. 6A. This semiconductor module is obtained by mounting a heat dissipating plate 30 to the semiconductor module M2 of the fifth embodiment described above. The heat dissipating plate 30 is fixed in close contact with the back (lower surface) of the substrate 10.

The heat generated in the first semiconductor device 11b is transferred to the heat dissipating plate 30 by way of the substrate 10, and radiated to the ambient space from many radiating fins of the plate 30. Because of such the heat dissipating function, the temperature rise of the first semiconductor device 11b is suppressed and as a result, the temperature rise of the second semiconductor device 12b is suppressed.

With the semiconductor module of the sixth embodiment, in this way, the heat generated in the first semiconductor device 11b is taken away from the periphery of the first semiconductor device 11b with the heat dissipating plate 30 and thus, the temperature rise of the first semiconductor device 11b is suppressed. Further, conduction of the heat generated in the first semiconductor device 11b to the second semiconductor device 12b is prevented by the interposer 40 having the cavity 41. The effectiveness of the thermal insulation effect of the interposer 40 is enhanced accordingly.

Since such the configuration is adopted, even if the second semiconductor device 12b comprises a sensitive characteristic to its operating temperature, the temperature rise of the second semiconductor device 12b is suppressed and therefore, the operation temperature of the second semiconductor device 12b can be lowered and constant. As a result, a semiconductor module with stable operation can be realized.

[Interposer of Seventh Embodiment, Through-Electrode Module]

A semiconductor module according to a fourth embodiment of the present invention is shown in FIG. 4B. This semiconductor module is obtained by mounting a case 31 to the semiconductor module M2 of the fifth embodiment described above. The case 31 has a box shape of an approximately rectangular parallelepiped whose lower surface is opened, and is fixed closely to the surface (upper surface) of the substrate 10. The case 31 covers (includes) the whole semiconductor module M2.

The substrate 10 and the case 31 constitute an inner space S of an approximately rectangular parallelepiped, and the semiconductor module M2 is located in the inner space S. The case 31 has an inlet 32 for introducing a heat-absorbing fluid L into the inner space S from the outside and an outlet 33 for discharging the fluid L from the inner space S to the outside. The inner space S is a closed space with the exception of the inlet and outlet 32 and 33.

The pump P for supplying the fluid L to the inlet 32 by applying a predetermined pressure to the fluid L, and the tubes T1 and T2 for connecting the pump P to the inlet 32 and the outlet 33, and the heat-absorbing fluid are the same as those used in the aforementioned fourth embodiment.

The fluid L is circulated from the pump P,→the tube T1,→the inner space S,→the tube T2, and→the pump P. The fluid L absorbs the heat generated from the semiconductor module M2 in the inner space S, and naturally dissipates the heat thus absorbed while flowing in the outside. In this way, the heat generated from the semiconductor module M2 is allowed to dissipate to the outside of the case 31.

The heat generated in the first semiconductor device 11b in the lower layer is transmitted to the fluid L and is dissipated to the outside from the outlet 33 by the flow of the fluid L. Due to this radiating function, the temperature rise of the first semiconductor device 11b is suppressed and as a result, the temperature rise of the second semiconductor device 12b in the upper layer is suppressed.

With the semiconductor module of the seventh embodiment, unlike the aforementioned sixth embodiment, the heat is taken away from the whole of the semiconductor module M2 and thus, the temperature rise of the heat-generating first semiconductor device 11b is suppressed. Further, conduction of the heat generated in the first semiconductor device 11b to the second semiconductor device 12b is prevented by the interposer 40 having the cavity 41. The effectiveness of the thermal insulation effect of the interposer 40 is enhanced accordingly.

Since such the configuration is adopted, even if the second semiconductor device 12b comprises a sensitive characteristic to its operating temperature, the temperature rise of the second semiconductor device 12b is suppressed and therefore, the operation temperature of the second semiconductor device 12b can be lowered and constant. As a result, a semiconductor module with stable operation can be realized.

[Formation Method of Interposer of Eighth Embodiment]

Next, a formation method of the aforementioned interposer will be explained below.

Figure 7:
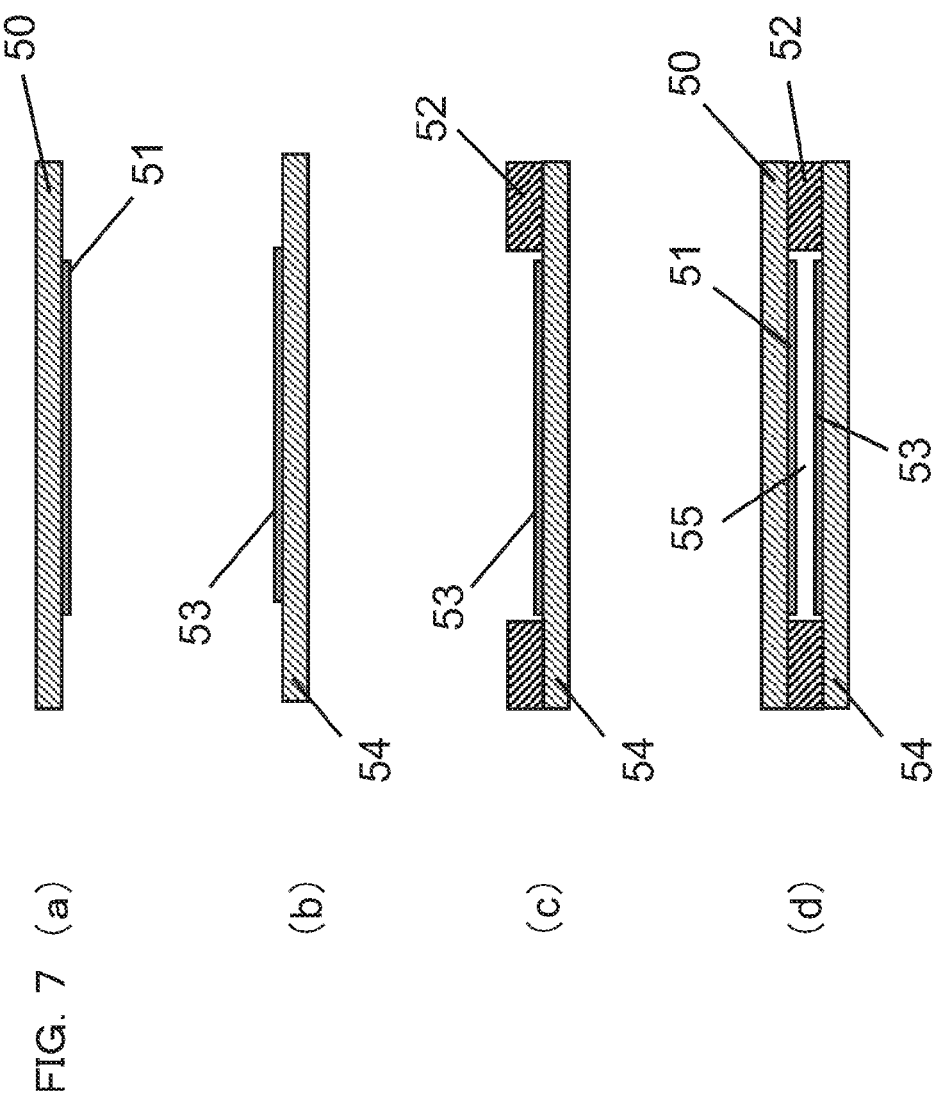
FIG. 7 is an explanatory cross-sectional view showing a first example of the formation method of the interposer used in the semiconductor module according to the second embodiment of the present invention.

FIG. 7 shows a method for forming the interposer of an eighth embodiment of the present invention. This method is a first example of the formation method of the interposer.

First, as shown in FIG. 7(*a*), a rectangular heat reflecting layer 51 is formed on the lower surface of a rectangular plate-shaped upper wall (upper plate) 50. The heat reflecting layer 51 is present except for the peripheral region of the lower surface of the upper wall 50, and does not cover the whole of the lower surface; however, the present invention is not limited to this. The heat reflecting layer 51 may cover the entire lower surface of the upper wall 50.

Next, as shown in FIG. 7(*b*), a rectangular heat reflecting layer 53 is formed on the upper surface of a rectangular plate-shaped lower wall (lower plate) 54. The heat reflecting layer 53 also is present except for the peripheral region of the upper surface of the lower wall 54, and does not cover the whole of the upper surface; however, the present invention is not limited to this. The heat reflecting layer 53 may cover the entire upper surface of the lower wall 54.

The upper wall 50 on which the heat reflecting layer 51 is formed and the lower wall 54 on which the heat reflecting layer 53 is formed may have the same configuration. In other words, two walls having the identical configuration may be formed. Further, the upper wall 50 and the lower wall 54 are preferably made of a material with low heat conduction; however, the present invention is not limited to this. For example, the heat reflecting layers 51 and 53 may be formed by using a technique such as depositing a metal such as gold or aluminum.

Next, as shown in FIG. 7(*c*), a side wall 52 is formed in the peripheral portion of the lower wall 54. As a material of the side wall 54, for example, glass or resin may be used. The side wall 52 is brought into close contact with the peripheral portion of the lower wall 54 by a method such as adhesion.

Next, as shown in FIG. 7(*d*), the lower surface of the top wall 50 is closely contacted (bonding) with the upper surface of the side wall 54 by using an adhesive or the like. By this adhesion, the upper, lower, and side walls 50, 54, and 52 are integrated, forming the body of the interposer; simultaneously with this, a cavity 55 is formed in the interior of the body. Because the vacuum is essential for the cavity 55, this adhesion (bonding) step is carried out in a vacuum atmosphere.

The interposer of the present invention is formed through the aforementioned steps. Materials for the structural elements, such as the upper, lower, and side walls 50, 54, and 52 the adhesion or the like for adhering the upper and lower walls 50 and 54 are selected in such a way that the vacuum state in the cavity 55 is maintained over a long period of time. By way of example, single crystal silicon is preferably used for the upper and lower walls 50 and 54, and glass is preferably used for the side wall 52. If such the materials as described here are used, the electrostatic bonding technique can be used for the bonding between the lower wall 54 and the side wall 52 and the bonding between the side wall 52 and the upper wall 50. Furthermore, since electrostatic bonding is carried out in vacuum and an obtainable vacuum sealing property of electrostatic bonding is sufficiently high, the vacuum in the cavity 55 is maintained for a long time. Since the upper wall 50 and the lower wall 54 are made of single crystalline silicon, it is also possible to form one or more wiring layers on each surface of the upper and lower walls 50 and 54 using a well-known technique.

Although not shown in FIG. 7, it is also possible to form through electrodes in the periphery of the interposer having the configuration FIG. 7(*d*). For example, by forming penetrating holes in the upper wall 50 (single-crystal silicon), the side wall 52 (glass), and the lower wall 54 (single-crystal silicon) in their vertical directions using processing techniques such as RIE (reactive ion etching), and then, by filling or depositing a conductive material in the penetrating holes, penetrating electrodes can be formed. Note that it is necessary to provide a suitable insulating film between the aforementioned conductive material and the upper and lower walls 50 and 54 to ensure electrical insulation.

[Interposer Formation Method of Ninth Embodiment]

Figure 8:
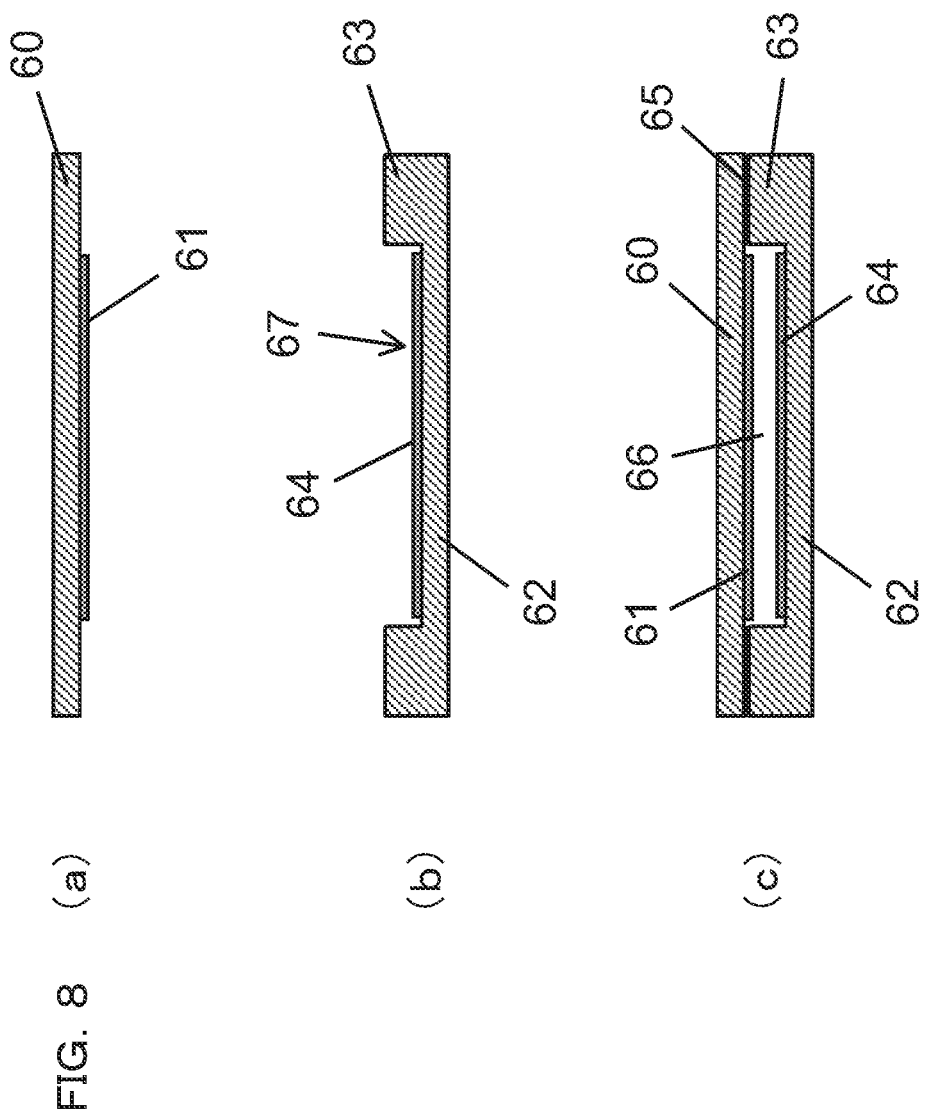
FIG. 8 is an explanatory cross-sectional view showing a second example of the formation method of the interposer used in the semiconductor module according to the second embodiment of the present invention.

FIG. 8 shows a method for forming an interposer of a ninth embodiment of the present invention. This method is a second example of the formation method of the interposer.

First, as shown in FIG. 8(*a*), a rectangular heat reflecting layer 61 is formed on the lower surface of a rectangular plate-shaped upper wall (upper plate) 60. The heat reflecting layer 61 is present except for the peripheral region of the lower surface of the upper wall 60, and does not cover the whole of the lower surface; however, the present invention is not limited to this. The heat reflecting layer 61 may cover the entire lower surface of the upper wall 60.

Next, as shown in FIG. 8(*b*), a rectangular plate-shaped lower wall 62 (lower plate) having a side wall 63 (a recess 67 is formed on the inside of the side wall 63) is prepared and then, a rectangular heat reflecting layer 64 is formed on the upper surface (the bottom of the recess 67) in the inside area of the side wall 63. In this step, unlike the aforementioned eighth embodiment (FIG. 7), the lower wall 62 and the side wall 63 are integrally formed. This configuration can be easily realized by forming the recess 67 in the central region of the base material of the lower wall 62 and forming the heat reflecting layer 64 on the bottom surface of the recess 67. Concretely speaking, a patterned photoresist layer is formed on the upper surface of a single crystal silicon plate, and the single crystal silicon plate is etched by RIE or the like using the photoresist layer as a mask, forming the recess. However, the thickness of the single crystal silicon plate is set to be equal to the thickness (height) of the side wall 63. Thereafter, a metal such as gold or aluminum is deposited on the bottom of the recess by vapor deposition, forming the heat reflecting layer 64.

Here, the heat reflecting layer 64 is present except for the peripheral region of the bottom surface of the lower wall 62, and does not cover the whole of the bottom surface; however, the present invention is not limited to this. The heat reflecting layer 64 may cover the entire bottom surface of the recess 67, cover the region from this bottom surface to the inner side face of the side wall 63, or cover the region from this inner side face to the top end face of the side wall 63.

Next, as shown in FIG. 8(*c*), using an epoxy-system adhesive 65 or the like, the lower surface of the top wall 60 is closely adhered (bonded) to the upper end face of the side wall 63. Thus, the upper wall 60, and the lower wall 62 with the side walls 63 are integrated, forming the body of the interposer; simultaneously with this, a cavity 66 is formed in the interior of the body. Because the vacuum is essential for the cavity 66, this adhesion (bonding) step is carried out in a vacuum atmosphere.

If the upper wall 60, and the lower wall 62 with the side wall 63, have been made of mono-crystalline silicon, and the heat reflecting layer 64 is not formed on the top end face of the side wall 63, it is also possible to make the close contact between the upper wall 60 and the side wall 63 by silicon-to-silicon thermal bonding in the step of FIG. 8(c).

Although not shown in FIG. 8, similar to the aforementioned eighth embodiment (FIG. 7), through electrodes may be formed in the periphery of the interposer with the structure of FIG. 8(c).

[Formation Method of Interposer of Tenth Embodiment]

Figure 9:
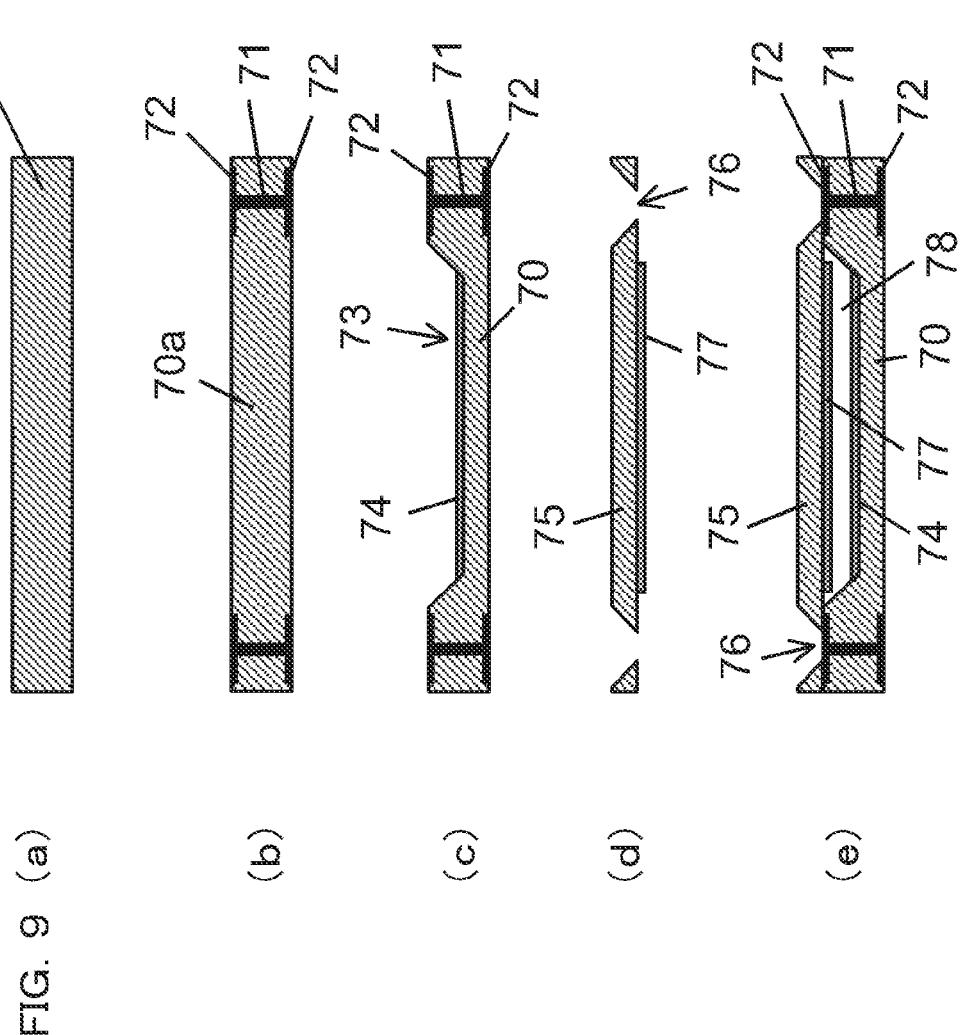
FIG. 9 is an explanatory cross-sectional view showing a first example of the formation method of the interposer used in the semiconductor module according to the fifth embodiment of the present invention.

FIG. 9 shows a method for forming the interposer of a tenth embodiment of the present invention. This method is a third example of the formation method of the interposer.

First, as shown in FIG. 9(a), a rectangular single-crystal silicon plate as a base material 70a of a lower wall (lower plate) is prepared.

Next, as shown in FIG. 9(b), through electrodes 71 are formed in the periphery of the base material 70a by a well-known method. Concretely speaking, penetrating holes are formed in the periphery of the base material 70a by RIE, and the inner side faces of the penetrating holes are covered with insulating layers (not shown), and thereafter, a conductive material is deposited or filled in the inside of the insulating layers. By giving conductivity to the through holes in this way, the through electrodes are formed. Subsequently, electrical connecting pads 72 are formed on the surface and back of the base material 70a to electrically connect the through electrodes.

Next, a recess 73 is engraved from the surface side of the base material 70a using a patterned mask (such as photoresist). For the formation of the recess 73, for example, an anisotropic etchant such as TMAH (tetra-methyl ammonium hydroxide) and KOH (potassium hydroxide) is used. With these etching solutions, since the etching rate is low for the specific silicon crystal surface ((111) plane), the edge of the recess 73 (slopes from the bottom of the recess 73 to the surface of a substrate 70) will be the exposed (111) plane. Thus, the lower wall (lower plate) 70 is formed. After that, a heat reflecting layer 74 is formed on the bottom surface of the recess 73. The state at this stage is shown in FIG. 9(c).

Next, as shown in FIG. 9(d), using the aforementioned anisotropic etching liquid, an opening 76 for exposing the pad 72 is formed from the upper surface of the upper wall (upper plate) 75 which is made of a rectangular single crystal silicon plate. Further, a heat reflecting layer 77 is formed on the lower surface of the upper wall 75 so as not to overlap with the opening 76.

Thereafter, the upper wall 75 on shown in FIG. 9(d) is adhered (bonded) to the upper surface of the lower wall 70 shown in FIG. 9(c), resulting in the interposer having the structure shown in FIG. 9(e). An adhesive or low melting point glass is used for this adhesion (bonding). A cavity 78 is formed by the recess 73 of the lower wall 70. Because the vacuum is essential for the cavity 78, this adhesion (bonding) step is carried out in a vacuum atmosphere.

In this embodiment, since the upper and lower walls 75 and 70 are made of single crystal silicon, one or more wiring layers can be formed on the surface and back of the body of the interposer.

[Formation Method of Interposer of Eleventh Embodiment]

Figure 10:
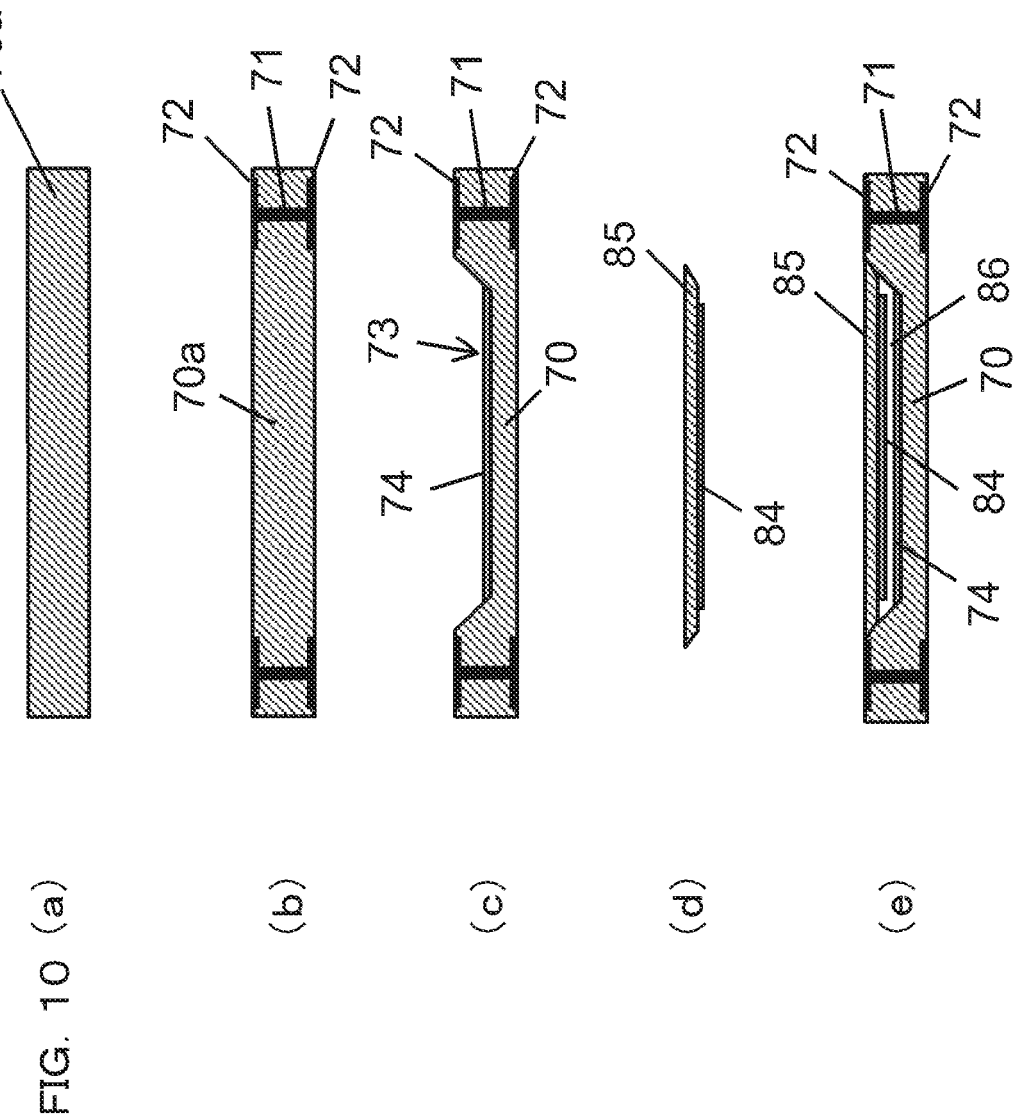
FIG. 10 is an explanatory cross-sectional view showing a second example of the formation method of the interposer used in the semiconductor module according to the fifth embodiment of the present invention.
Figure 11:
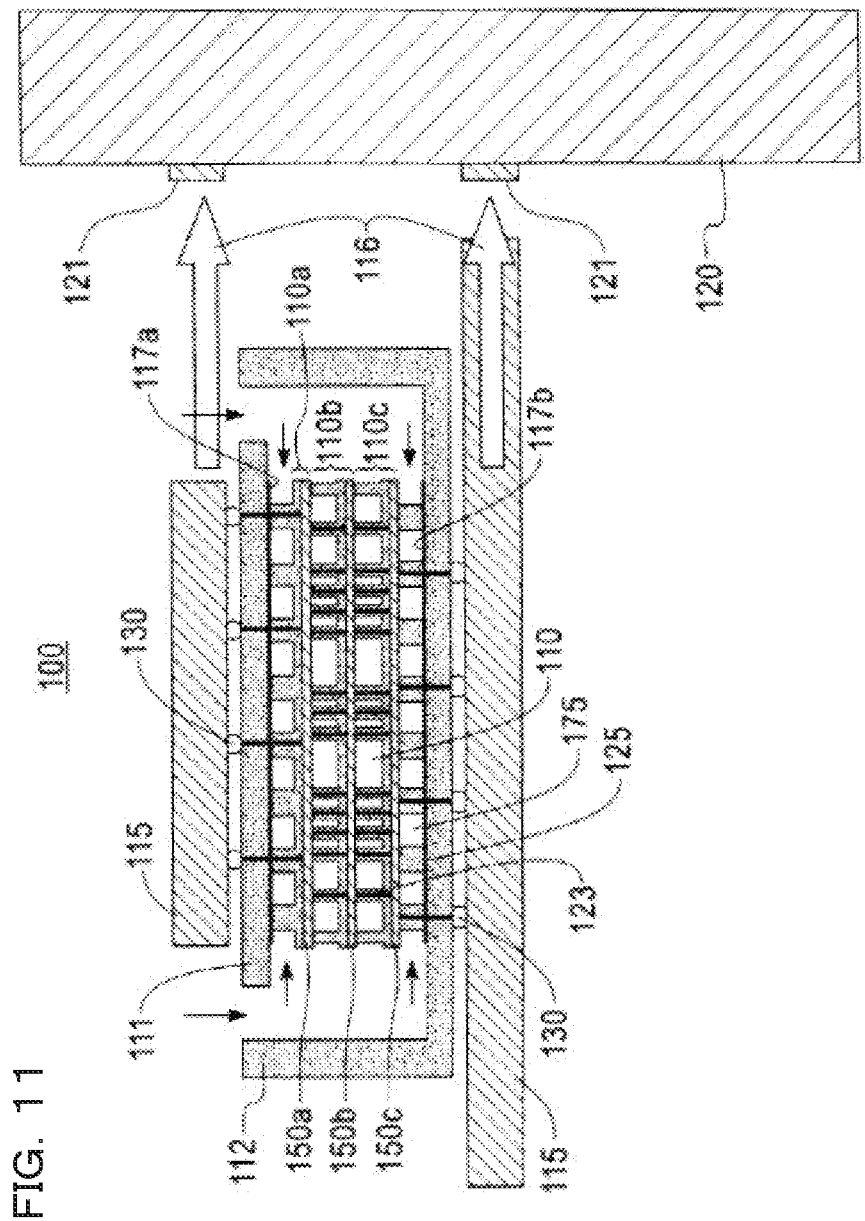
FIG. 11 is a cross-sectional view showing the conventional mounting structure of a semiconductor device.

FIG. 10 illustrates a method for forming the interposer according to an eleventh embodiment of the present invention. This method is a fourth example of the method for forming the aforementioned interposer. In FIG. 10, the same reference numerals as those in FIG. 9 denote the same structural elements.

Since the steps from FIG. 10(a) to FIG. 10(c) are the same as those of the steps from FIG. 9(a) to FIG. 9(c), the explanation about them is omitted here.

Next, as shown in FIG. 10(d), an upper wall (upper plate) 85 with a heat reflecting layer 84 is formed. The wall 85 can be obtained easily by removing obliquely the peripheral portion of a single crystal silicon plate as the base material by etching to form a tapered peripheral portion, and by forming a heat reflecting layer 84 on the lower surface of the wall 85.

Thereafter, the upper wall (upper plate) 85 shown in FIG. 10(d) is brought into contact (joined) with the upper surface of the lower wall 70 (lower plate) shown in FIG. 10(c) by using an adhesive, a low melting-point glass, or the like, resulting in the structure shown in FIG. 10(e). Because the recess 73 forms the cavity 86, and the cavity 86 needs to be held in vacuum, the above adhesion process is carried out in a vacuum atmosphere.

In the present embodiment, unlike the aforementioned tenth embodiment (FIG. 9), the upper plate 85 is structured to enter into the recess 73 of the lower plate 70. That is, the upper plate 85 does not cover the surface of the side wall portion (the portion where the pad 72 is provided) of the lower plate 70. In this configuration, there is an advantage that formation of an opening (which corresponds to the opening 76 in FIG. 9) is unnecessary, and that the manufacturing technique is simplified.

[Modification]

As explained above, the embodiments of the present invention are described in detail. In this specification, the configuration of the interposer and the semiconductor module using this interposer are described; however, many configurations other than the exemplified above are possible.

For example, the configuration that the power consumption of the second semiconductor device is larger than that of the first semiconductor device, the configuration of stacked semiconductor devices in three or more layers, and the configuration that each of the upper and lower semiconductor devices sandwiching the interposer comprises two or more semiconductor devices (for example, a plurality of semiconductor devices are disposed in the same plane on the upper surface of the interposer) are possible.

In either configuration, thermal insulation between semiconductor devices arranged at each side of an interposer is intended with a vacuum layer of the interposer, thereby realizing a high-density and high speed semiconductor module. This is the gist of the present invention.

INDUSTRIAL APPLICABILITY

The present invention can be applied to an interposer that facilitates cooling of semiconductor devices with an increasing tendency of power consumption, and a semiconductor module and a mounting structure using the interposer. Further, without being limited to a semiconductor module mainly composed of electronic circuits, the present invention can be widely applied to other high-power devices (e.g., light-emitting modules and optical communication modules).

DESCRIPTION OF REFERENCE NUMERALS 11a, 11b semiconductor device
12a, 12b semiconductor device
13 bonding wire
14 through electrode
15 conductive ball
16 filler
17 adhesive
20a upper wall
20b lower wall
20c side wall 21a, 21b, 21c heat reflecting layer
22a, 22c insulating layer
23 cavity
24 interposer
25, 26 heat source
30 heat sink
31 case
32 inlet
33 outlet
40 interposer
41 cavity
42 through electrode
43 cavity
43 conductive ball
50 upper wall
51 heat reflecting layer
52 side wall
53 heat reflecting layer
54 lower wall
54 side wall
55 cavity
60 upper wall
61 heat reflecting layer
62 lower wall
63 side wall
64 heat reflecting layer
65 adhesive
66 cavity
70 lower wall
70a base material of lower wall
71 through electrode
72 electrical connection pad
74 heat reflecting layer
75 upper wall
76 opening
77 heat reflecting layer
78 cavity
84 heat reflecting layer
85 upper wall
86 cavity
L cooling fluid
M1 semiconductor module
M2 semiconductor module
P pump
S inner space
T1 tube
T2 tube

The invention claimed is:

1. An interposer for being mounted between a first heat source and a second heat source which is stacked on the first heat source, the interposer comprising:
a body having a cavity which is maintained in vacuum; and
a heat reflecting region formed on an inner wall surface of the cavity,
wherein, on use, a combination of the cavity and the heat reflecting region has a function of suppressing heat conduction between the first heat source and the second heat source.

2. The interposer according to claim 1, wherein the body comprises an upper wall adjacent to the second heat source, a lower wall adjacent to the first heat source, and a side wall connecting the upper wall and the lower wall; and
the upper wall, the lower wall, and the side wall define the cavity.

3. The interposer according to claim 1, wherein the heat reflecting region is formed on an inner surface of the upper wall and an inner surface of the lower wall; and
the heat reflecting region is not formed on an inner surface of the side wall.

4. A semiconductor module comprising:
the interposer according to claim 1;
a first semiconductor device serving as the first heat source; and
a second semiconductor device serving as the second heat source.

5. The semiconductor module according to claim 4, further comprising a heat sink mounted directly or indirectly on at least one of the first and second semiconductor devices.

6. A semiconductor module comprising:
an interposer comprising a body having a cavity which is maintained in vacuum, and a heat reflecting region formed on an inner wall surface of the cavity;
a first semiconductor device mounted on one side of the interposer;
a second semiconductor device mounted on the other side of the interposer;
a case that includes the interposer, the first semiconductor device, and the second semiconductor device; and
means for pressurizing and introducing a cooling fluid into the case.

7. A semiconductor module comprising:
the interposer according to claim 3;
a first semiconductor device serving as the first heat source; and
a second semiconductor device serving as the second heat source.

8. The interposer according to claim 2, wherein the upper wall, the lower wall, and the side wall are made of single-crystal silicon.

9. The interposer according to claim 2, wherein the upper wall and the lower wall are made of single-crystal silicon, and the side wall is made of glass.

10. The interposer according to claim 2, wherein the upper wall, the lower wall, and the side wall are made of resin.

11. The interposer according to claim 1, wherein the body comprises through electrodes for electrical connection between the first heat source and the second heat source.

12. A semiconductor module comprising:
a first semiconductor device;
a second semiconductor device stacked on the first semiconductor device; and
an interposer mounted between the first semiconductor device and the second semiconductor device;
wherein the interposer comprises a body having a cavity which is maintained in vacuum, and a heat reflecting region formed on an inner wall surface of the cavity.

13. The semiconductor module according to claim 12, wherein on use, a combination of the cavity and the heat reflecting region has a function of suppressing heat conduction between the first heat source and the second heat source.

14. The semiconductor module according to claim 12, wherein the body of the interposer comprises an upper wall adjacent to the second semiconductor device, a lower wall adjacent to the first semiconductor device, and a side wall connecting the upper wall and the lower wall; and
the upper wall, the lower wall, and the side wall define the cavity.

15. The semiconductor module according to claim 12, wherein the heat reflecting region of the interposer is formed on an inner surface of the upper wall and an inner surface of the lower wall; and
the heat reflecting region is not formed on an inner surface of the side wall.

16. The semiconductor module according to claim 12, further comprising a heat sink mounted directly or indirectly on at least one of the first and second semiconductor devices.

* * * * *